US012638526B2

(12) United States Patent
Freytag

(10) Patent No.: US 12,638,526 B2
(45) Date of Patent: May 26, 2026

(54) ADDITIONAL ELEMENT FOR FOCUSING A TIME-VARYING MAGNETIC FLUX FOR INSTALLATION IN A SAMPLE RECEPTACLE OF AN NMR PROBE HEAD

(71) Applicant: Bruker Switzerland AG, Faellanden (CH)

(72) Inventor: Nicolas Freytag, Pfaffhausen (DE)

( * ) Notice: Subject to any disclaimer, the term of this patent is extended or adjusted under 35 U.S.C. 154(b) by 0 days.

(21) Appl. No.: 19/046,167

(22) Filed: Feb. 5, 2025

(65) Prior Publication Data

US 2025/0264557 A1 Aug. 21, 2025

(30) Foreign Application Priority Data

Feb. 15, 2024 (DE) ..................... 10 2024 201 418.4

(51) Int. Cl.
*G01R 33/42* (2006.01)
*G01R 33/36* (2006.01)

(52) U.S. Cl.
CPC ......... *G01R 33/3628* (2013.01); *G01R 33/42* (2013.01)

(58) Field of Classification Search
CPC .... G01R 33/42; G01R 33/3628; G01R 33/00; G01R 31/3191; G01R 33/0035;
(Continued)

(56) References Cited

U.S. PATENT DOCUMENTS 4,680,549 A 7/1987 Tanttu
4,866,387 A * 9/1989 Hyde ................... G01R 33/365
324/318

(Continued)

FOREIGN PATENT DOCUMENTS

EP 1707976 10/2006

OTHER PUBLICATIONS

Match NMR Tubes Supplier—Bruker Store. The Bruker Corporation, [retrieved on Jan. 3, 2024]. "" Retrieved from the Internet: <URL: https://store.bruker.com/products/match-nmr-tube?size=1.7%2520mm>.

(Continued)

*Primary Examiner* — Lee E Rodak
*Assistant Examiner* — Taqi R Nasir
(74) *Attorney, Agent, or Firm* — DECODE Legal Inc.

(57) ABSTRACT

An additional element for focusing a time-varying magnetic flux (B1), for installation in a sample receptacle of an NMR probe head includes one or more cover elements that are each electrically conductive along a respective outer surface. The cover elements form one or more closed conductor loops, each enclosing a conductor loop area, that collectively form the cover zone, which has an area $A_{cover}$. The cover zone at least partially encloses a passage window having an area $A_{window}$ with $A_{cover} \geq 2 * A_{window}$. The additional element includes at least one capacitively acting structure, so that the additional element forms an electrical resonant circuit comprising the one or more cover elements, with a natural resonance of a resonance frequency RF, where 5 MHz $\leq$ RF $\leq$ 3000 MHz. The additional element can be used to improve the signal-to-noise ratio with low-volume test samples when measuring in an existing NMR probe head.

25 Claims, 22 Drawing Sheets

(58) Field of Classification Search
CPC ............ G01R 33/0358; G01R 33/0356; G01B
7/004; G01C 17/38; G06F 3/012; H01L
39/223
USPC ......................................................... 324/309
See application file for complete search history.

(56) References Cited

U.S. PATENT DOCUMENTS

| | | | | |
|---|---|---|---|---|
| 5,262,727 | A | * | 11/1993 | Behbin .................. G01R 33/30 |
| | | | | 324/318 |
| 8,063,639 | B2 | * | 11/2011 | Zens .................... G01R 33/302 |
| | | | | 324/322 |
| 2020/0217911 | A1 | * | 7/2020 | Funk .................. G01R 33/3642 |

OTHER PUBLICATIONS

Jacques P. Vallee "Observations of the Magnetic Fields Inside and Outside the Solar System: From Meteorites (~10 attoparsecs), Asteroids, Planets, Stars, Pulsars, Masers, To Protostellar Cloudlets (<1 parsec)", Fundamentals of Cosmic Physics, 1998, vol. 19, pp. 319-422.

Bastawrous et al "Lenz Lenses in a Cryoprobe: Boosting NMR Sensitivity Toward Environmental Monitoring of Mass-Limited Samples", Analytical Chemistry, 2023, vol. 95, No. 2, pp. 1327-1334.

Spengler et al. "Magnetic Lenz lenses improve the limit-of-detection in nuclear magnetic resonance", PLOS One, Aug. 15, 2017, vol. 12, No. 8.

Wadhwa et al "Topologically optimized magnetic lens for magnetic resonance applications", Magnetic Resonance, 2020, vol. 1, No. 2, pp. 225-236.

Liang et al. "Broadband stripline Lenz lens achieves 11×NMR signal enhancement", Scientific Reports, 2024, vol. 14, No. 1.

Tajabadi et al. "Compact Magnetic Field Amplification by Tuned Lenz Lens", IEEE Sensors Journal, Nov. 15, 2023, vol. 23, No. 22, pp. 27154-27160.

* cited by examiner

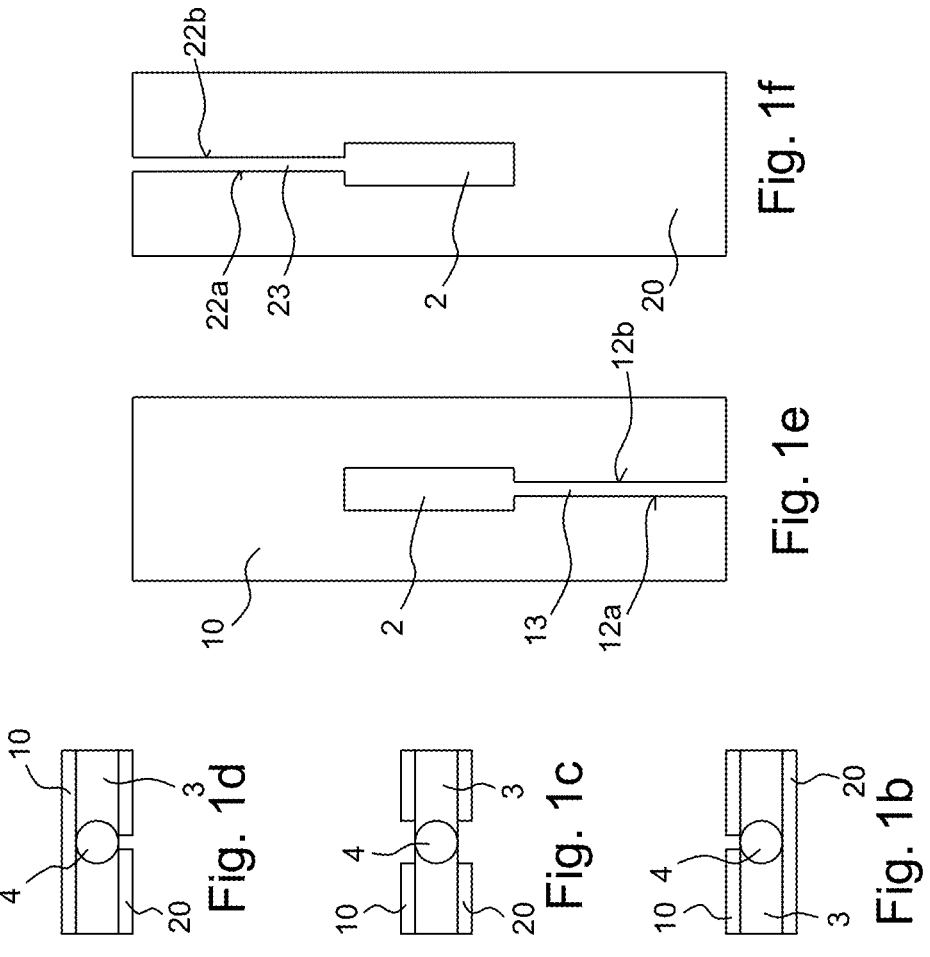
Fig. 1f
Fig. 1e
Fig. 1d
Fig. 1c
Fig. 1b
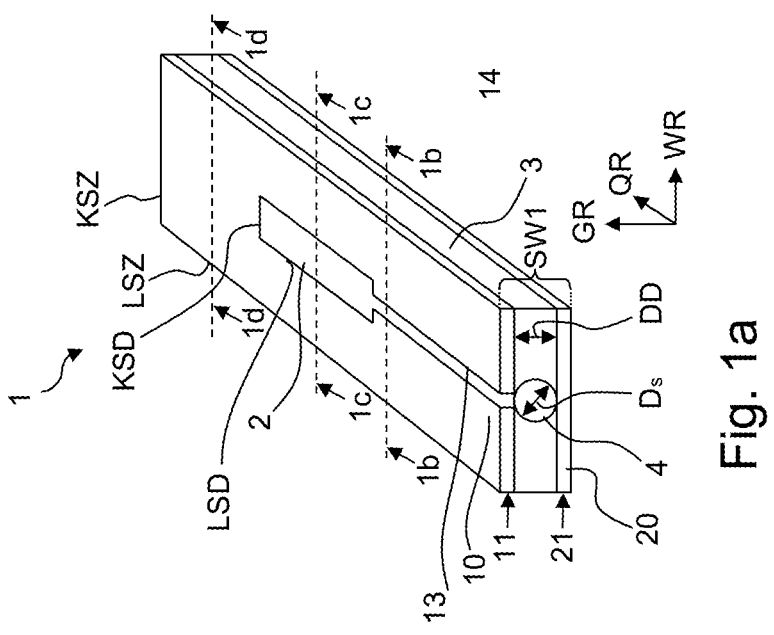
Fig. 1a

ADDITIONAL ELEMENT FOR FOCUSING A TIME-VARYING MAGNETIC FLUX FOR INSTALLATION IN A SAMPLE RECEPTACLE OF AN NMR PROBE HEAD

BACKGROUND OF THE INVENTION

Field of the Invention

The invention relates to an additional element for focusing a time-varying magnetic flux, for installation in a sample receptacle of an NMR probe head, wherein the additional element forms a cover zone and a passage window at least with respect to a plan view along a base direction, wherein the cover zone encloses the passage window with or without interruptions, wherein the additional element has one or more cover elements which are electrically conductive at least in the area of part of their respective edge curve or outer surface, wherein the entirety of the cover elements forms one or more closed conductor loops which, in said plan view, each enclose a conductor loop area, wherein the entire covering of the one or more conductor loop surfaces forms the cover zone, which has an area $A_{cover}$, wherein the additional element is electrically non-conductive in the area of the passage window, and wherein the passage window has an area $A_{window}$ with $A_{cover} \geq 2*A_{window}$. Such an additional element is known from US 2020/0217911 A1.

Description of the Related Art

Nuclear magnetic resonance (NMR) spectroscopy can be used to analyze the chemical composition of test samples. For this purpose, a test sample is exposed to a homogeneous static magnetic field ("BC field", constant in time) of a background magnet (often a superconducting background magnet), and radio-frequency (RF) pulses ("B1 field", variable in time) are irradiated into the test sample perpendicular to the static magnetic field and interact with the nuclear spins of the atoms and molecules in the test sample. A resulting RF signal of the test sample is measured and the composition of the test sample can be deduced from the measurement result. For the measurement, the test sample is placed in an NMR probe head comprising an RF resonator or an RF coil, and the RF resonator or RF coil encloses the test sample. The NMR probe head typically protrudes into a magnet bore of the background magnet. For a good signal-to-noise ratio (SNR) of the NMR measurement, the B0 field and the product B1*Q of B1 field per unit current in the range of the test sample and the quality factor Q of the resonant circuit tuned to the measurement frequency should each be as large as possible.

NMR probe heads are comparatively expensive measuring instruments, and many users only have an NMR probe head that is designed with a sample receptacle for a cylindrical body with a specific diameter of usually 5 mm ("standard probe head"). Typically, sample material available for measurement is diluted with a solvent and filled into an elongated sample tube, usually with an outer diameter of 5 mm and an inner diameter of usually 4.2-4.5 mm ("standard sample tube"), which is inserted into the sample receptacle. The test sample should extend over a length of at least 30 mm, preferably at least 40 mm, in the sample tube to ensure easy and good homogenization ("shimming") of the static magnetic field and to fill the active volume or the field of view of the RF coil.

In many applications, however, only a small amount of sample material is available. For measurement in a standard probe head with a standard sample tube, the sample material can be highly diluted with the solvent to sufficiently fill the standard sample tube. In this case, only a comparatively weak measurement signal with a low signal-to-noise ratio is obtained from the test sample.

The Bruker Corporation, Billerica, MA, USA, offers special thin sample tubes ("capillaries") called "MATCH NMR Tubes" at https://store.bruker.com/products/match-nmr-tube, accessed on Jan. 3, 2024, which have a smaller outer diameter (e.g. 2.0 mm) and a smaller inner diameter (e.g. 1.6 mm) than standard sample tubes, and can be used to set up a desired filled length of the thin sample tube with a small volume of a liquid test sample (e.g. with the above dimensions, a filled length of 40 mm with a sample volume of 80 µl). The thin sample tubes are placed in a holder called the "MATCH Insert Assembly", and the holder can be placed in the sample receptacle of a standard probe head. The thin sample tubes can facilitate the shimming of test samples with low sample volumes and allow the filling height to be reduced without negatively affecting the homogenization of the static magnetic field in the field of view, but the signal-to-noise ratio remains comparable to that when diluted in a standard NMR tube. In addition, the thin sample tubes are mechanically sensitive, in particular to bending and weight loads, and require careful handling.

It has become known from US 2020/0217911 A1 that an additional element can be inserted into an RF resonator or its RF coil, with which the B1 field in the RF coil of the NMR probe head can be focused in a central area in the RF coil. The additional element is also known as a Lenz lens. The Lenz lens comprises one or more metal cover elements, through which one or more closed conductor loops are set up. The cover elements are used to set up a cover zone and a passage window in a plan view along a base direction that corresponds to the direction of the B1 field. The induced current flow in the conductor loops is reversed on the inside around the passage window compared to the outer area. The B1 field is displaced from the cover zone and at least partially focused into the passage window in the central area of the RF coil. This allows a stronger B1 field to be achieved in the central area where the test sample is placed. This is intended to improve the signal-to-noise ratio in NMR measurements with a conventional NMR probe head. In one embodiment, cover elements are arranged in planes that lie on top of one another in the base direction, wherein two half-perforated disk-shaped cover elements are arranged in each plane, between the radial edges of which there is in each case a gap, and wherein the gaps of the different planes are aligned; correspondingly, same direction currents are established in the cover elements lying one above the other, so that these cover elements do not exhibit any significant capacitive coupling.

The Lenz lens proposed in US 2020/0217911 A1 induces countercurrents in the cover elements, whose associated magnetic field is opposed to the external, time-varying B1 field. This effectively reduces the inductance of the RF coil or the RF resonator of the NMR probe head by the mutual inductance M. The measuring resonant circuit of the NMR probe head, to which the RF coil belongs, therefore experiences a frequency shift FV (frequency increase) with the Lenz lens with respect to its base resonance frequency without the Lenz lens. The stronger the focusing of the B1 field by the Lenz lens, the stronger the frequency shift.

Typically, an NMR probe head has a tuning device that can be used to change the base resonance frequency of a natural resonance of the electrical measuring resonant circuit within a limited tuning range in order to measure a desired nucleus in a specific test sample. The tuning range of the tuning device is typically less than 20 MHz for measuring of protons and in the range of 1-2 MHz for measuring nuclei at low resonance frequencies (of particular interest are, for example, nitrogen, carbon or phosphorus). If the frequency shift caused by the Lenz lens is small enough, the tuning device can still compensate for it. However, if the frequency shift caused by the Lenz lens becomes too large, the test sample can no longer be measured with the existing tuning device and NMR probe head. This limits the achievable SNR improvement with the Lenz lens when using an existing NMR probe head. If the B1 field in the area of the sample receptacle of an NMR probe head were significantly displaced or focused (e.g. by a factor of 3 or more), frequency shifts of up to 50 MHz would be expected, which can no longer be compensated. Accordingly, only a comparatively small part of the B1 field generated by the RF coil or RF resonator can be focused using a lens according to US 2020/0217911 A1, and accordingly only a comparatively limited improvement in the SNR can be achieved.

From U.S. Pat. No. 4,680,549 A an MRI apparatus has become known, comprising a first, larger RF coil for transmitting and receiving signals to and from a target area, and a second, smaller RF coil for receiving signals from a portion of the target area.

EP 1,707,976 A1 describes a further MRI apparatus, wherein an auxiliary coil is arranged between a body coil and an object to be examined. When RF pulses are emitted from the body coil, an induced current flows through the auxiliary coil, generating a magnetic field.

J. P. Vallée, Fundamentals of Cosmic Physics, Vol. 19, pp. 319-422 (1998), describes a magnetic dipole field in section 2.2.

SUMMARY OF THE INVENTION

The invention provides an additional element with which the signal-to-noise ratio can be further improved with small-volume test samples when measured in an existing NMR probe head. This is achieved according to the invention by an additional element of the type mentioned at the beginning, wherein the additional element comprises at least one capacitively acting structure, so that the additional element forms an electrical resonant circuit comprising the one or more cover elements, with a natural resonance of a resonance frequency RF, with 5 MHz≤RF≤3000 MHz.

The invention proposes the use of an additional element which, on the one hand, can focus a time-varying magnetic flux (i.e. the B1 field) from the cover zone (at least to a large extent) into the passage window in the manner of a Lenz lens, and on the other hand, establishes an electrical resonant circuit which has a natural resonance with a resonance frequency in a range between 5 MHz and 3000 MHz ("self-resonant structure"). To establish such an electrical resonant circuit, the additional element comprises at least one capacitively acting structure (also referred to as a capacitive structure for short), for example a surface capacitor between opposite coupling surfaces of a cover element or of a plurality of cover elements.

The resonant circuit established by the additional element can couple with a measuring resonant circuit of the RF resonator or the RF coil of the NMR probe head, for which purpose the additional element is typically arranged in the sample receptacle within the RF coil or the RF resonator of the NMR probe head. The coupling causes the natural resonance of the electrical measuring resonant circuit to be split into a lower mode and an upper mode. The lower mode has a lower mode resonance frequency MRF1, which is lower than the uncoupled resonance frequency by a frequency shift RF1, and the upper mode has an upper mode resonance frequency MRF2, which is higher than the uncoupled resonance frequency of the measuring resonant circuit by a frequency shift RF2.

At the same time, the presence of the additional element in the RF coil of the RF resonator of the NMR probe head causes a frequency shift FV due to the displacement of the time-varying magnetic flux, namely a frequency increase by FV of the resonance frequency of the measuring resonant circuit.

If an NMR measurement is now carried out on a test sample by means of the lower mode, the associated frequency shift RF1 can at least partially compensate for the frequency shift FV; preferably, the compensation is substantially exact (e.g. with a difference |FV−RF1| of 10 MHz or less, preferably 5 MHz or less, particularly preferably 2.5 MHz or less, very particularly preferably 1 MHz or less), which can be achieved in particular by a suitable geometry of the additional element with regard to the NMR probe head provided and the choice of the natural resonance of the additional element. For a given tuning range of a tuning device of the NMR probe head for the resonance of the measuring resonant circuit, a comparatively large (and, with sufficiently good compensation, in principle arbitrarily large) frequency shift FV can then also be accepted, whereby a stronger focusing of the time-varying magnetic flux becomes accessible, and thus also a stronger improvement of the signal-to-noise ratio compared to a conventional Lenz lens.

The additional element according to the invention functions both as a Lenz lens (i.e. an element that passively focuses the time-varying magnetic flux) and as a resonant circuit, which causes resonance splitting when coupled to the measuring resonant circuit.

By means of the cover zone or the cover elements and the passage window, a time-varying magnetic flux (B1 field) directed along the base direction can be displaced from the area of the cover zone and focused (at least for the most part) in the area of the passage window. According to the invention, $A_{cover} \geq 2*A_{window}$; a time-varying magnetic flux without an additional element, which would be distributed over $A_{cover}+A_{window}$ and would be focused on $A_{window}$ with the additional element, would be distributed over an area smaller by a factor of 3 and amplified accordingly. Typically, the additional element (in the area of the passage window) achieves a 5-fold or greater amplification of the B1 field within the scope of the invention.

Preferably is $A_{cover} \geq 3*A_{window}$, particularly preferably is $A_{cover} \geq 5*A_{window}$, very particularly preferably is $A_{cover} \geq 10*A_{window}$.

The one or more cover elements are used to set up one or more closed conductor loops from which the time-varying magnetic flux is displaced and (at least for the most part) focused into the passage window. In this case, the (ohmic) internal current flow at the edge of the passage window is the opposite of the (ohmic) external current flow on the outside of the cover element or cover elements. It should be noted that a respective cover element does not have to be designed to be completely electrically conductive; instead, electrical conductivity in the area of an edge curve or an outer surface is sufficient. Typically, a cover element is formed by one or more cylindrical metallic bodies and/or one or more metallic plates; however, ring-like geometries, such as metallic plates with holes, are also possible. It should also be noted that in general, a respective cover element on its own, i.e. with its conductor material with ohmic resistance, in a plan view along the base direction, only incompletely encompasses the passage window. The passage window is not electrically conductive; typically, the passage window is simply formed by a recess or opening and is "empty"; however, it can also be partially or completely occupied by a dielectric.

According to the invention, the electrical resonant circuit set up by the additional element has a resonance frequency RF with 5 MHz≤RF≤3000 MHz. With such a resonance frequency, a splitting of the natural resonance of the electrical measuring resonant circuit of the NMR probe head can be achieved with conventional RF resonators or conventional NMR probe heads, in which the resonance shift RF1 of the lower mode is approximately in the range of the frequency shift FV by the additional element with significant focusing (in particular with a factor of 3 or more) of the time-varying magnetic flux. Preferably is RF≤2500 MHz; further preferably is RF≥400 MHz; particularly preferably is RF≥500 MHz. Typically, RF>BRF, with BRF being the base resonance frequency of the NMR probe head or the measuring arrangement (without additional element). Note that the resonance of the resonant circuit of the additional element typically generates a dipolar field.

The electrical resonant circuit, which is formed by the additional element, contains the at least one capacitively acting structure. Such a capacitively acting structure is typically set up by the geometry and arrangement of the cover element(s); however, alternatively or additionally, one or more capacitors can be connected to the cover element(s) via supply lines. An (alternating) current circuit that can be assigned to the electrical resonant circuit, which contains the capacitively acting structure, typically completely encloses the passage window (in top view along the base direction). It should be noted that conventional Lenz lenses do not contain any noticeable capacitively acting structures, so that these conventional Lenz lenses cannot form resonant circuits with resonance frequencies in the frequency range according to the invention.

The additional elements according to the invention can be constructed with cover elements substantially arranged in a flat manner. The cover elements are then perpendicular to the base direction. This allows a B1 field compression and (usually only) a resonant circuit to be set up in a cost-effective and compact manner with regard to (usually only) the base direction. The flat cover elements (usually arranged in one or more sandwiches) can be arranged in a glass tube for better handling. Alternatively, the cover elements can also be constructed three-dimensionally. Then it is relatively easy to set up (at least) a second natural resonance in a second orientation (in which field compression can also occur), if desired. In addition, the basic shape of the additional element can then already be substantially cylindrical, similar to a conventional sample tube, to facilitate handling.

Embodiments Concerning the Conduction of Electricity

An embodiment of the additional element according to the invention is preferred in which the additional element is designed such that the current on the additional element has no current nodes at this natural resonance. In other words, the mode of natural resonance has no current nodes. In this case, a very good coupling of the resonant circuit of the additional element with the measuring resonant circuit of the NMR probe head is possible.

An embodiment in which the additional element is designed such that a circulating current flows on the additional element at this natural resonance, completely enclosing the passage window, is equally preferred. In other words, in the mode of the natural resonance, a substantially constant alternating current flows around the passage window (in a plan view along the base direction); this alternating current also flows through the at least one capacitive structure. In this case, a very good coupling of the resonant circuit of the additional element with the measuring resonant circuit of the NMR probe head is also possible.

In an advantageous embodiment, it is provided that the at least one capacitively acting structure comprises two mutually opposing coupling surfaces that are formed on two cover elements or on two opposing ends of a cover element, and that the mutually opposing coupling surfaces at least partially overlap and have an overlap area UEF, wherein UEF≥0.5 mm$^2$, preferably ≥1.0 mm$^2$. This is an easy way to set up a capacitively acting structure with a comparatively high capacitance. The coupling surfaces are preferably designed in a flat manner, but they can also be designed in a curved manner. In particular, flat coupling surfaces can lie perpendicular to the base direction (e.g. in the case of additional elements with at least one sandwich of cover elements, see below), but they can also lie parallel or at an oblique angle to the base direction. UEF≤300 mm$^2$ is still preferred.

Embodiments with Sandwich Geometry

An embodiment is preferred in which the additional element comprises at least a first sandwich of cover elements, wherein the first sandwich comprises a first sandwich plane and a second sandwich plane, wherein one or more cover elements extend in a planar manner in the first sandwich plane, which is perpendicular to the base direction, and one or more cover elements extend in a planar manner in the second sandwich plane, which is perpendicular to the base direction, wherein the first sandwich plane and the second sandwich plane are superposed with respect to the base direction, and the cover elements of the first sandwich plane and the second sandwich plane overlap at least partially. The overlapping cover elements of the first and second sandwich planes make it possible to set up coupling surfaces or capacitively acting structures in a particularly simple and compact manner. It should be noted that additional elements in sandwich geometry are particularly useful for the investigation of 1H nuclei.

In an advantageous development of this embodiment, it is provided that in the first sandwich plane, the one or more covering elements are arranged around the passage window, and ends of the one or more covering elements that are located opposite each other in the circumferential direction are each separated by a gap, that in the second sandwich plane, the one or more cover elements are arranged around the passage window, and ends of the one or more cover elements that are located opposite each other in the circumferential direction are each separated by a gap, and that the interruption gaps of the first sandwich plane and the second sandwich plane are offset from each other in the circumferential direction.

This structure has proven particularly effective in practice for establishing a circulating alternating current flow in the resonant circuit of the additional element. A respective interruption gap of one sandwich plane is bridged by an uninterrupted portion of a cover element of the other sandwich plane and vice versa. At the overlapping flat cover elements as a surface capacitor adjacent in front of or behind an interruption gap in one sandwich plane, the alternating current in the electrical resonant circuit can easily pass over into the other sandwich plane and there, in the bridging portion of the cover element, overcome the interruption gap, thus forming a closed circuit (for alternating current).

In a preferred sub-variant of this further development, it is provided that the first sandwich plane contains exactly one cover element that encompasses the passage window and whose ends are separated from one another at an interruption gap, that the second sandwich plane contains exactly one cover element that encompasses the passage window and whose ends are separated from one another at an interruption gap, and that the interruption gaps of the first sandwich plane and the second sandwich plane are located opposite each other in the circumferential direction, in particular wherein the passage window has a long side and a short side and the interruption gaps of the first sandwich plane and the second sandwich plane open into the short side of the passage window.

It should be noted that the test sample or an associated sample channel or sample space is typically aligned along the long side. In this sub-variant, the interruption gap, which represents a disturbance to the structure with regard to the desired field homogeneity, is located at the end of the test sample. Since the compensation of the susceptibility at the end of the test sample is only approximate, a disturbance of the structure does not have such a great effect on the line width of the test sample. The design is accordingly particularly fault-tolerant, in particular compared to an interruption gap which is a gap located somewhere in the middle of the window or in the middle of the long side. Typically, the interruption gap is located approximately, and preferably exactly, in the middle of the respective short side.

In a preferred development, a layer of dielectric is arranged between the cover elements of the first sandwich plane and the second sandwich plane. In this context, dielectric refers to any weakly or non-conductive substance in which the existing charge carriers are not freely mobile and which has a relative permittivity $\varepsilon_r > 1$, regardless of whether this substance is function-determining or is merely used as an insulating material. The dielectric can be used to influence the capacitance of a capacitive structure set up between the sandwich planes.

If the layer has a homogeneous thickness and is long in the z-direction (B0-direction) relative to the window of the structure/additional element, then the susceptibility of the dielectric does not have to be compensated and the structure/additional element can be optimized for other properties, e.g. electrical losses. This can increase the performance of the additional element.

Typically, the following applies to the distance DD ("thickness of dielectric") of the cover elements of the first sandwich plane and the second sandwich plane (in the base direction) in the event that a sample channel or sample space runs between the first sandwich plane and the second sandwich plane: $0.5 \cdot Ds \leq DD \leq 1.5 \cdot Ds$, where Ds: diameter of the sample channel or sample space.

If the sample channel or sample space runs elsewhere, in particular above or below the first sandwich (e.g. between the first sandwich and a second sandwich, see below), the following typically applies: $0.1 \text{ mm} \leq DD \leq (Dp - Ds)/2$, where Dp: maximum outer diameter of the additional element; note that Dp corresponds substantially to Dmax, where Dmax: maximum diameter of a cylindrical body that can be inserted into the sample receptacle of an associated NMR probe head. The same applies to any second sandwich (see below).

Advantageous is also a development, which provides that the additional element further comprises at least a second sandwich of cover elements, wherein the second sandwich comprises a third sandwich plane and a fourth sandwich plane, wherein one or more cover elements extend in a planar manner in the third sandwich plane, which is perpendicular to the base direction, and one or more cover elements extend in a planar manner in the fourth sandwich plane, which is perpendicular to the base direction, wherein the third sandwich plane and the fourth sandwich plane are superimposed with respect to the base direction, and the cover elements of the third sandwich plane and the fourth sandwich plane overlap at least partially, and that the first sandwich of cover elements and the second sandwich of cover elements are located one above the other with respect to the base direction, and the cover elements of the first sandwich and of the second sandwich overlap at least partially, in particular wherein the additional element forms a sample channel or sample space that runs between the first sandwich and the second sandwich. The second sandwich can be used to increase the capacitance in the resonant circuit of the additional element. In each sandwich, and if desired also between the two sandwiches, surface capacitors can be set up in space saving manner. Typically, for a distance Dz ("thickness of the gap") between the second sandwich plane and the third sandwich plane (located between the first sandwich and the second sandwich where the sample channel or sample space runs) applies: $0.5 \cdot Ds \leq Dz \leq 1.5 \cdot Ds$, where Ds: diameter of the sample channel or sample space.

Preferred is also a development, in which the additional element comprises a cylindrical glass tube into which the cover elements of the sandwich or sandwiches are inserted. With cylindrical glass tubes, the additional element can be adapted to the sample receptacle of a conventional NMR probe head, and the additional element can be used immediately with the glass tube and can also be easily handled by conventional transport devices.

Embodiments with Dumbbell-Like Geometry

An advantageous embodiment provides that the additional element has two mutually opposing end portions, each of which is formed with a metal cylinder, and a connecting portion formed with a metal plate running perpendicular to the base direction, wherein the connecting portion connects the end portions, wherein the passage window is formed in the connecting portion, and the passage window electrically subdivides the metal plate of the connecting portion transversely to the base direction, that a sample channel or sample space runs along the cylinder axes of the metal cylinders through the end portions and through the connecting portion in the area of the passage window, and that at least one of the end portions has at least one upper slot that extends from the sample channel or sample space to a cylinder outer side of the associated metal cylinder and electrically subdivides the metal cylinder of this end portion in the circumferential direction, and at least one of the end portions has at least one lower slot extending from the sample channel or sample space to an cylinder outer side of the associated metal cylinder and electrically subdividing the metal cylinder of this end portion in the circumferential direction, wherein, with respect to the base direction, the upper slot runs above the metal plate and the lower slot runs below the metal plate, in particular wherein the upper slot and the lower slot are filled with a dielectric. The cylindrical end portions can be used to form a basic shape of the additional element that is suitable for direct insertion into the sample receptacle of a conventional NMR probe head. In addition, capacitively acting structures with a comparatively large capacitor area or comparatively large capacitance can be easily set up via the upper slot and the lower slot.

In a preferred development of this embodiment, it is provided that a metal tube is arranged on the metal cylinder of a respective end portion, which has an upper slot and/or lower slot, wherein a radial gap between the metal cylinder and the metal pipe is filled by a dielectric, and that the metal tube overlaps the slot on the cylinder outer side of the metal cylinder. In addition to the surface capacitor at the top and/or slot, a parallel AC current path can be set up via two further surface capacitors, which lead via the radial gap in front of the slot to the metal tube and after the slot from the metal tube back to behind the gap.

The metal tube is an easy and effective way to increase the capacitance in the resonant circuit.

A further development in which at least one of the end portions has both an upper slot and a lower slot is also advantageous. This is easy to manufacture and enables a particularly high capacitance even on a metal cylinder.

In another advantageous development, the additional element has an additional central slot that runs perpendicular to the base direction in the center of the additional element and electrically subdivides the two metal cylinders and also the metal plate into an upper half and a lower half, wherein the central slot intersects the sample space or sample channel, and wherein the central slot is filled with a dielectric. The central slot can be used for an ohmic subdivision into an upper and a lower half of the intermediate piece. This allows the alternating current to be directed in a desired manner. Likewise, one or more surface capacitors can be set up via the central slot, which can serve as capacitively acting structures. If desired, the central slot can also be used to set up the additional element in two orientations rotated by 90°.

Also preferred is an embodiment which provides that the additional element has two mutually opposing end portions, each of which is formed with a metal cylinder, and a connecting portion formed with four metal plate parts that are arranged in a cross shape around a sample channel or sample space and that are oriented at 45° to the base direction, wherein the connecting portion of the metal plate parts connects the end portions, wherein the passage window is formed in the connecting portion, that the sample channel or the sample space runs along the cylinder axes of the metal cylinders through the end portions and the connecting portion in the area of the passage window, and that a first end portion of the end portions has a first slot that runs parallel to the base direction and electrically subdivides the metal cylinder of this end portion into a right half and a left half, and a second end of the end portions has a second slot that runs centrally through the additional element perpendicular to the base direction and electrically subdivides the metal cylinder of this end portion into an upper half and a lower half, in particular, wherein the first slot and the second slot are filled with a dielectric, and wherein, in particular, the first slot and the second slot have a different slot width and/or are filled with a different dielectric. This embodiment is well suited for using the additional element optionally in two orientations, rotated 90° to one another, in order to be able to measure two different atomic nuclei without having to rotate the insert in between. An individual resonance frequency can be set up in the respective orientation via the slot widths and/or the choice of dielectric in the respective slot.

An advantageous embodiment is one which provides that the additional element is formed from a cylindrical metal body, wherein the metal body has a central portion and two side portions on either side of the central portion, wherein the metal body has a recess for forming the passage window in the central portion, the recess running along the base direction through the metal body and electrically subdividing the central portion in the direction transverse to the base direction, that the additional element has a sample channel or sample space that extends along a cylinder axis of the metal body, wherein the sample channel or sample space intersects the passage window, and that the metal body has slotted areas that extend from the sample channel or sample space to an outside of the metal body and electrically subdivide the metal body in the central portion and/or in one of the side portions, in particular wherein a dielectric is arranged in the slotted areas and/or in the recess. This embodiment is very easy to manufacture. For example, slotted areas parallel to the base direction can be provided above and/or below the sample channel/sample space in a first of the side portions. Furthermore, for example, in the second of the side portions, slotted areas can be provided perpendicular to the base direction to the left and/or right of the sample channel/sample space.

Another sub-variant of this development provides that the metal body has slotted areas, with a first slotted area in a first side portion of the two side portions, wherein the first slotted area runs centrally through the first side portion parallel to the base direction, a second slotted area in a second side portion of the two side portions, wherein the second slotted area runs centrally through the second side portion, perpendicular to the base direction, and a third slotted area in the central portion, wherein the third slotted area runs through the central portion, perpendicular to the base direction. This variant is easy to manufacture and also well suited for a setup of two resonators (in orientations rotated by 90°). If the additional element is intended for two resonances, the recess of the passage window for the first resonance can simultaneously represent a third slotted area for the second resonance.

FURTHER EMBODIMENTS

Further preferred is an embodiment in which the additional element has a substantially cylindrical outer shape, in particular wherein the external shape corresponds to a sample tube. Then the additional element can be loaded and unloaded using conventional sample transportation systems. The additional element can easily be placed directly into a conventional NMR probe head.

Also advantageous is an embodiment in which the additional element comprises a tuning element with which the resonance frequency RF of the electrical oscillating circuit can be changed, in particular wherein a total capacitance contained in the electrical resonant circuit can be changed by means of the tuning element. This makes it possible to easily adapt the additional element to an existing probe head and/or a specific measuring task. To change the total capacitance, the tuning element comprises at least one tunable capacitor, without prejudice to any other non-tunable capacitors/capacitances in the electrical resonant circuit.

A development of this embodiment is preferred in which the additional element comprises a trimmer capacitor as a tuning element, in particular wherein the trimmer capacitor is arranged at a distance of at least ENT from the passage window on the remaining additional element with respect to a transverse direction that runs perpendicular to the base direction, with ENT≥5 mm. The transverse direction generally corresponds to the direction of a long side/longitudinal direction of the passage window. With the trimmer capacitor, the additional element can be tuned easily and inexpensively. By arranging the device at least 5 mm away from the passage window (in the transverse direction along the long side of the passage window), interference with the static magnetic field can be minimized, which would negatively affect the line width of the measured substances.

Preferred is also a development of the above embodiment, wherein a layer of dielectric is provided between the cover elements of a first sandwich plane and a second sandwich plane (see above), and it is provided that the tuning element is designed to change a thickness DD of the dielectric layer by means of mechanical pressure on the cover elements of the first sandwich plane and/or the second sandwich plane, in particular wherein the tuning element comprises a screw. The mechanical pressure allows the distance between the cover elements of the first and second sandwich plane to be changed easily, and the resonance frequency RF can be set very precisely. With a screw, this is also inexpensive and easy to handle. The screw is preferably arranged at least 5 mm (in the transverse direction) from the passage window.

A particularly preferred embodiment is one in which the additional element comprises at least one shielding element which blocks the penetration of time-varying magnetic flux in at least one part of a sample channel or sample space of the additional element that is adjacent to the passage window, in particular wherein the additional element comprises at least two shielding elements which block the penetration of time-varying magnetic flux into two parts of the sample channel or sample space of the additional element that are adjacent on opposite sides of the passage window. This can improve the signal-to-noise ratio when the test sample is small.

A preferred embodiment is one in which the additional element is designed such that it is substantially transparent to a time-varying magnetic flux along a second direction, which runs orthogonally to the base direction, so that the time-varying magnetic flux along the second direction in a sample channel or sample space of the additional element in the area of the passage window is reduced relatively by a maximum of 20% by the additional element, in particular wherein the additional element forms a passage gap that runs perpendicular to the base direction and intersects the sample channel or sample space. This allows a test sample to be efficiently measured with the additional element in two orientations at the same time, in particular with regard to two different atomic nuclei. If desired, the passage gap can be partially filled with a dielectric (the intersection area with the sample channel or sample space is not filled with the dielectric). Furthermore, a sample intake aid can be provided in the passage gap, which allows a test sample to be introduced in a reproducible manner. This can be done, for example, by means of a bore or a blind hole in the dielectric.

A particularly preferred embodiment is one which provides that the additional element forms a further cover zone and a further passage window with respect to a further plan view along a further base direction, wherein the further cover zone encloses the further passage window with or without interruptions, wherein the further base direction runs perpendicular to the base direction, wherein the additional element has one or more further cover elements which are electrically conductive at least in the area of part of their respective edge curve or outer surface, wherein the totality of the further cover elements forms one or more further closed conductor loops which in said further plan view each enclose a further conductor loop area, wherein the total covering of the one or more further conductor loop areas forms the further cover zone, which has a further area $AW_{cover}$, wherein the additional element is electrically non-conductive in the area of the further passage window, and wherein the further passage window has a further area $AW_{window}$ with $AW_{cover} \geq 2*AW_{window}$, wherein the additional element comprises at least one further capacitively acting structure, so that the additional element forms a further electrical resonant circuit comprising the one or more further cover elements, with a natural resonance of a further resonance frequency RFW, with 5 MHz≤RFW≤3000 MHz.

This means that the additional element can be used to examine two atomic nuclei. The base direction, the further base direction and a transverse direction are typically perpendicular to each other, wherein the transverse direction runs along a respective long side of the pass window and the further pass window. Typically, RF and RFW are different, corresponding to different nuclei to be examined. The additional element can be structured analogously to the base direction with respect to the further base direction or the further cover zone, the further passage window and the further cover elements (see above) and can be used analogously to the base direction in a measuring arrangement, by interaction with a further RF coil and a further measuring resonant circuit of the NMR probe head (see below).

Measuring Arrangements According to the Invention

The present invention also includes a measuring arrangement comprising an NMR probe head and an additional element according to the invention, as mentioned above, wherein the additional element is arranged in a sample receptacle of the NMR probe head, wherein the probe head comprises an RF coil that can be used to generate a B1 field in the sample receptacle along a direction of incidence, and wherein the additional element in the sample receptacle is oriented to the RF coil such that the base direction of the additional element and the direction of incidence are parallel. With the measuring arrangement, NMR measurements with a high signal-to-noise ratio can also be carried out with small sample volumes. The additional element compresses the B1 field into the passage window, thereby improving the SNR. At the same time, a frequency shift due to the displacement of magnetic flux caused by the use of the lower mode of a resonance splitting in the measuring resonant circuit of the NMR probe head can be at least partially, and preferably substantially, exactly compensated by coupling the resonant circuit of the additional element. This makes it easy to perform NMR measurements in the tunable range of the NMR probe head.

Preferred is an embodiment of the measuring arrangement according to the invention, in which the probe head comprises a guide aid with which, when the additional element is introduced into the sample receptacle of the NMR probe head, the additional element is automatically aligned with respect to the NMR probe head such that the base direction of the additional element and the direction of incidence are aligned with each other in a defined manner, in particular are parallel. This simplifies the sample change and ensures accurate measurement results. Typically, the guidance aid comprises rails and/or wedge surfaces and/or stops.

A preferred embodiment provides that the additional element forms a sample channel or sample space for a test sample, wherein the sample channel or sample space has a diameter $D_s$, and a circular cylindrical body having a maximum diameter $D_{max}$ can be introduced into the sample receptacle of the NMR probe head, wherein $D_s$ and $D_{max}$ are each measured perpendicular to a transverse direction, wherein the transverse direction runs perpendicular to the base direction, and that $D_s \leq 0.6*D_{max}$, preferably $D_s \leq 0.4*D_{max}$. With these dimensions, small sample volumes can be measured efficiently.

An embodiment is also advantageous which provides that the NMR probe head forms an active volume in the sample receptacle, which has a cross-sectional area $A_{active}$, measured in the plane perpendicular to the base direction, wherein $A_{cover} \geq 0.2 * A_{active}$, preferably $A_{active} \geq 0.3 * A_{cover}$, particularly preferable $A_{cover} \geq 0.4 * A_{active}$. This allows a significant increase in the signal-to-noise ratio to be achieved.

A particularly preferred embodiment is one which provides that the NMR probe head has a tuning device with which a base resonance frequency BRF of a natural resonance of an electrical measuring resonant circuit of the RF coil without the additional element in the sample receptacle can be tuned in a range from UF to OF, where UF: lowest tunable frequency and OF: highest tunable frequency and UF<BRF<OF, that the presence of the cover element(s) of the additional element in the sample receptacle of the NMR probe head increases the resonance frequency of the measuring resonant circuit by a frequency shift FV with respect to the base resonance frequency BRF by displacing magnetic flux, and furthermore, with the additional element introduced in the sample receptacle, the measuring resonant circuit couples with the electrical resonant circuit, which the additional element forms, causing the natural resonance of the electrical measuring resonant circuit to split into a lower mode with a mode resonance frequency MRF1 and an upper mode with a mode resonance frequency MRF2, wherein MRF1 is decreased by a frequency shift RF1 relative to the uncoupled resonance frequency of the electrical measuring resonant circuit and MRF2 is increased by a frequency shift RF2 relative to the uncoupled resonance frequency, with MRF1=BRF+FV−RF1 and MRF2=BRF+FV+RF2, and that the NMR probe head and the additional element are designed such that in particular, a coupling between the measuring resonant circuit and the electrical resonant circuit and, furthermore, the resonance frequency RF of the electrical resonant circuit of the additional element are set up such that OF−BRF>RF−FV and BRF−UF>FV−RF1.

In this embodiment, after the additional element is introduced, the NMR probe head remains in its tunable range for NMR measurements, which is tunable by the tuner.

The frequency shift of RF1 (and also of RF2) depends on the resonance properties of the electric resonant circuit of the additional element and the coupling with the RF coil and the resonance properties of the electric resonant circuit of the NMR probe head. Therefore, by changing in particular the total capacitance in the electrical resonant circuit of the additional element, the frequency shift RE1 can be changed, and thus a design can be found that meets the above conditions. With the above conditions, the mode resonance frequency MRF1 remains in the tunable range of the tuning device, and can be shifted back to the original frequency FRQ using the tuning device.

Preferably, OF−BRF>RF1−FV+(OF−UF)/5 and/or BRF−UF>FV−RF1+(OF−UF)/5 still applies. This leaves a certain reserve to compensate for extreme sample properties, also taking into account frequency changes due to matching (in particular highly lossy test samples, according to the first inequality with OF) or to compensate for a change in the static B0 field, e.g. due to a drift of the NMR magnet (according to the second inequality with UF).

UF is the lowest frequency that can be tuned (with the tuning device in the measuring resonant circuit) with any quality factor, and OF is the highest frequency that can be tuned (with the tuning device in the measuring resonant circuit) with any quality factor (in each case without additional element).

Also within the scope of the present invention is the use of a measurement arrangement according to the invention, as described above, in an NMR measurement, wherein the NMR probe head is arranged in a B0 field of a background magnet, wherein the B0 field runs in the area of the sample receptacle of the NMR probe head along a transverse direction, wherein the transverse direction runs perpendicular to the base direction, wherein a test sample is arranged in a sample channel or a sample space of the additional element at least in the area of the passage window, wherein for a volume VOL of the measuring sample applies: VOL≤100 μl, preferably VOL≤40 μl, particularly preferably VOL≤10 μl, very particularly preferably VOL≤5 μl, and wherein a mode resonance frequency MRF1 of a lower mode of the measurement resonant circuit is tuned with the tuning device to a nuclear resonance frequency of a measurement nucleus contained in the test sample. In the context of use, the measurement of test samples with a small sample volume with good SNR using a conventional probe head is simple and cost-effective.

Further advantages of the invention are found in the description and the drawing. Likewise, the features mentioned above and those detailed below can be used according to the invention individually or collectively in any combination. The embodiments shown and described are not to be understood as an exhaustive list, but rather have an exemplary character for the description of the invention.

BRIEF DESCRIPTION OF THE DRAWINGS

FIGS. 1a-1f schematically show a first embodiment of an additional element according to the invention, comprising a first sandwich of cover elements. FIG. 1a shows an oblique view; FIG. 1b shows a cross section in a front part; FIG. 1c shows a cross-section in a central part; FIG. 1d shows a cross-section in a rear part; FIG. 1e shows a top view of the cover element of the first sandwich plane; and FIG. 1f shows a top view of the cover element of the second sandwich plane.

FIG. 2a corresponds to the cover element of the first sandwich plane; and FIG. 2b corresponds to the cover element of the second sandwich plane.

FIG. 3a shows the B1 field without the additional element; and FIG. 3b shows the B1 field with the additional element.

FIG. 4a shows part of the circulating current in the cover element of the first sandwich plane; FIG. 4b shows part of the circulating current in the cover element of the second sandwich plane;

FIG. 4c shows the circulating current in the additional element in longitudinal section; and FIG. 4d shows the entire circulating current in top view/projection.

FIG. 5a shows a resonance curve of the RF resonator without additional element; FIG. 5b shows a resonance curve of the RF resonator taking into account the frequency shift due to field displacement of the additional element; FIG. 5c shows a resonance curve of the RF resonator taking further into account the resonance splitting due to coupling with the resonant circuit of the additional element; FIG. 5d shows a resulting resonance curve of the lower mode compared to the resonance curve without additional element, wherein MRF1=BRF.

FIG. 8a shows a top view of the cover elements of the first sandwich plane; FIG. 8b shows a top view of the cover elements of the second sandwich plane; and FIG. 8c shows an entire circulating current at natural resonance in top view/projection.

FIG. 9a shows an oblique view; FIG. 9b shows a top view of the cover element of the first sandwich plane; FIG. 9c shows a top view of the cover element of the second sandwich plane; FIG. 9d shows a top view of the cover element of the third sandwich plane; FIG. 9e shows a top view of the cover element of the fourth sandwich plane.

FIG. 20a shows an overall perspective view of the additional element; and FIG. 20b shows a perspective end view of a section of the additional element taken along plane B shown in FIG. 20a.

FIG. 21a shows a general view; FIG. 21b shows a cross-section along section line b-b of FIG. 21a; FIG. 21c shows a cross-section along section line c-c of FIG. 21a; and FIG. 21d shows a cross-section along section line d-d of FIG. 21a.

DETAILED DESCRIPTION

Figure 2B:
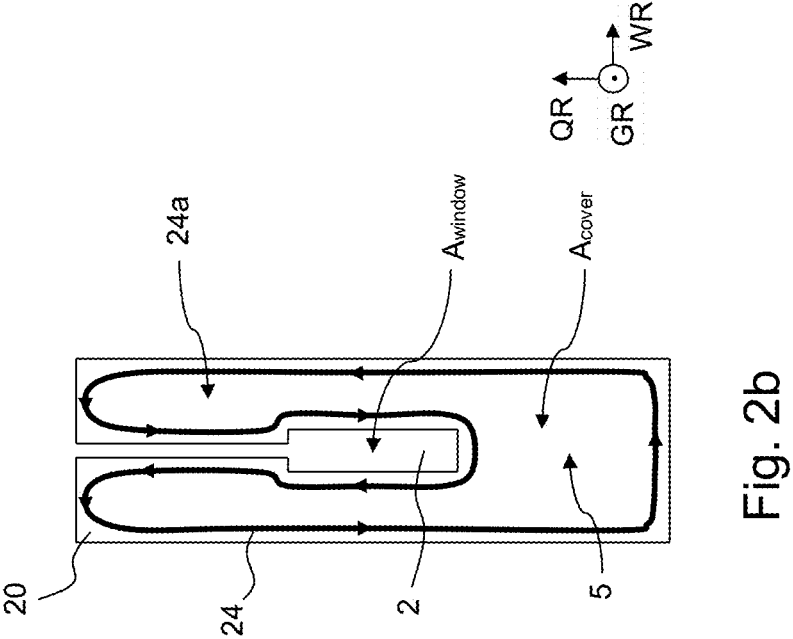
FIGS. 2a-2b schematically show closed conductor loops corresponding to the embodiment of FIG. 1a-1f.

FIGS. 1a-1f schematically illustrate a first embodiment of an additional element 1 according to the invention. FIG. 1a shows an oblique view, and FIGS. 1b, 1c and 1d show cross sections at the planes marked B, C, D in FIG. 1a. The additional element 1 can be arranged together with a test sample in the sample receptacle of an NMR probe head (the latter is not shown in more detail, but cf. e.g. FIG. 3 and FIG. 23).

In the first embodiment, the additional element 1 is structured like a sandwich and comprises here a first (upper) cover element 10 in a first sandwich plane 11, a second (lower) cover element 20 in a second sandwich plane 21, and an intermediate layer 3 of a dielectric. This arrangement can be understood as a (first) sandwich SW1 of cover elements 10, 20. The sandwich planes 11 and 21 are each perpendicular to a base direction GR and are located one behind the other in relation to this base direction GR. FIG. 1e shows a top view of cover element 10, and FIG. 1f shows a top view of cover element 20 (in each case from above, top view along the base direction GR).

The additional element 1 is substantially cuboid overall and has a long side LSZ and a short side KSZ in the plane perpendicular to the base direction GR. The additional element 1 contains a passage window 2, which here is rectangular in plan view (plan view along the base direction GR), and also has a long side LSD and a short side KSD. A transverse direction QR runs perpendicular to the base direction GR, which here runs parallel to the long sides LSZ, LSD. The short sides KSZ and KSD run along a further direction WR. The directions GR, QR and WR are orthogonal to one another.

Here in the layer 3 of the dielectric, a sample space 4 in the form of a cylindrical bore runs centrally in the additional element 1 along the transverse direction QR, wherein the sample space 4 runs through the passage window 2. Layer 3 has a thickness of DD. The sample space 4 has a diameter $D_s$. In the embodiment shown, DD=$D_s$. Typically, $D_s$ is about 2 mm or less.

A thin sample tube with a test sample can be arranged in the sample space 4. Sample material located in the area of the passage window 2 can be subjected to an NMR measurement. If the sample space 4 in the additional element 1 is liquid-tight, it can also be used directly as a sample channel for a liquid test sample (not shown in detail in each case). In NMR measurement, a homogeneous static background magnetic field B0 runs along the transverse direction QR, and a time-varying magnetic field B1 runs along the base direction GR. The B1 field is concentrated in the area of the passage window 2 (not shown in detail, but cf. FIG. 3).

Both cover elements 10, 20 are constructed here in the plane perpendicular to the base direction GR in an approximately C-shape, and each almost completely encloses the passage window 2. In the embodiment shown, the cover elements 10, 20 are made entirely of metal, in this case copper. A narrow interruption gap 13 and 23 remains at each opposite end 12a, 12b and 22a, 22b of the cover elements 10, 20. The interruption gaps 13, 23 here each run along the base direction GR and centrally on the short side KSD of the passage window 2, but on opposite sides of the passage window 2.

Figure 2A:
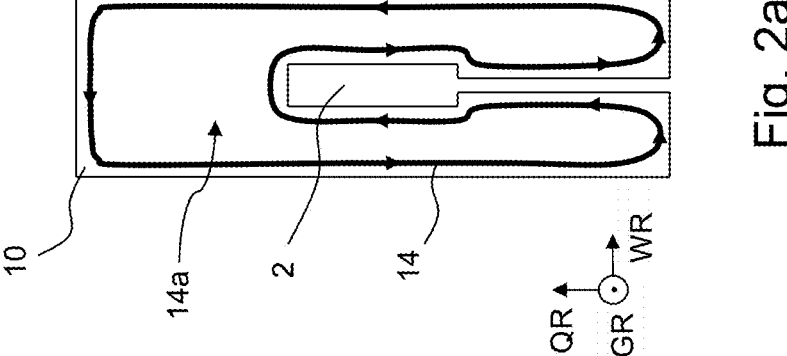

FIGS. 2a and 2b again illustrate the cover element 10 and the cover element 20, in each case in top view (plan view against the base direction GR of FIG. 1a; the base direction GR in FIGS. 2a, 2b is therefore perpendicular to the drawing plane). When an external, variable magnetic field (B1 field) is applied along the base direction GR, this magnetic field is blocked by the electrically conductive cover elements 10, 20 and cannot penetrate the cover elements 10, 20. The B1 field induces a (fully ohmic) circulating current along a closed conductor loop 14, 24 in the area of the edge curve of a respective cover element 10, 20. The magnetic field is displaced within the associated conductor loop area 14a, 24a. However, the passage window 2 is located outside the two conductor loop areas 14a, 24a. The current flow at the outer edge of the cover elements 10, 20 is in each case inverse to the current flow at the inner edge of the cover elements 10, 20, which surrounds the passage window 2. Accordingly, the magnetic flux can concentrate in passage window 2.

The total covering of the two conductor loop areas 14a, 24a (in plan view along the base direction) is designated as cover zone 5 and has an area of $A_{cover}$. In the scope of the invention, $A_{cover}$ is significantly larger than the window area $A_{window}$, with $A_{cover} \geq 2*A_{window}$, and here with approx. $A_{cover}=12*A_{window}$.

Figure 3B:
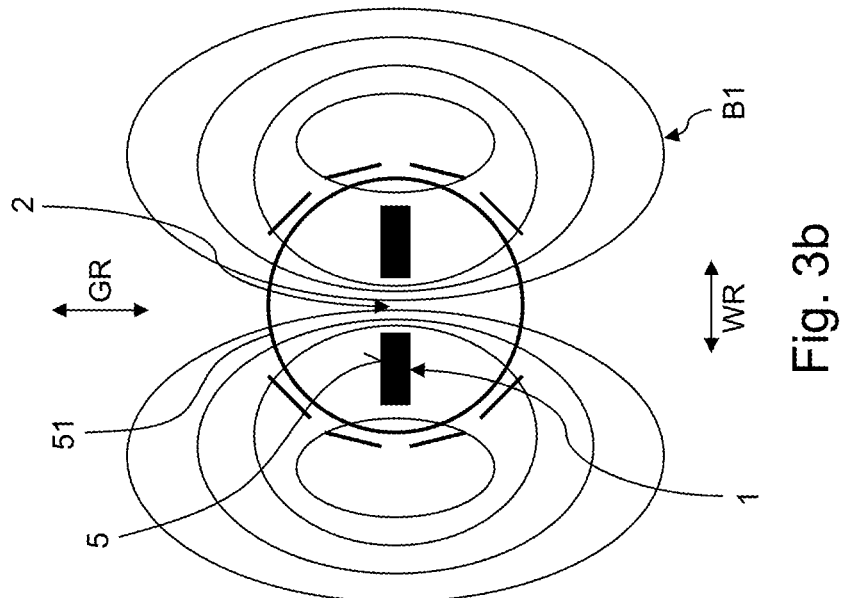
FIGS. 3a-3b schematically show the focusing of the B1 field in the embodiment of FIGS. 1a-1f in cross-section within an RF coil of an NMR probe head.
Figure 3A:
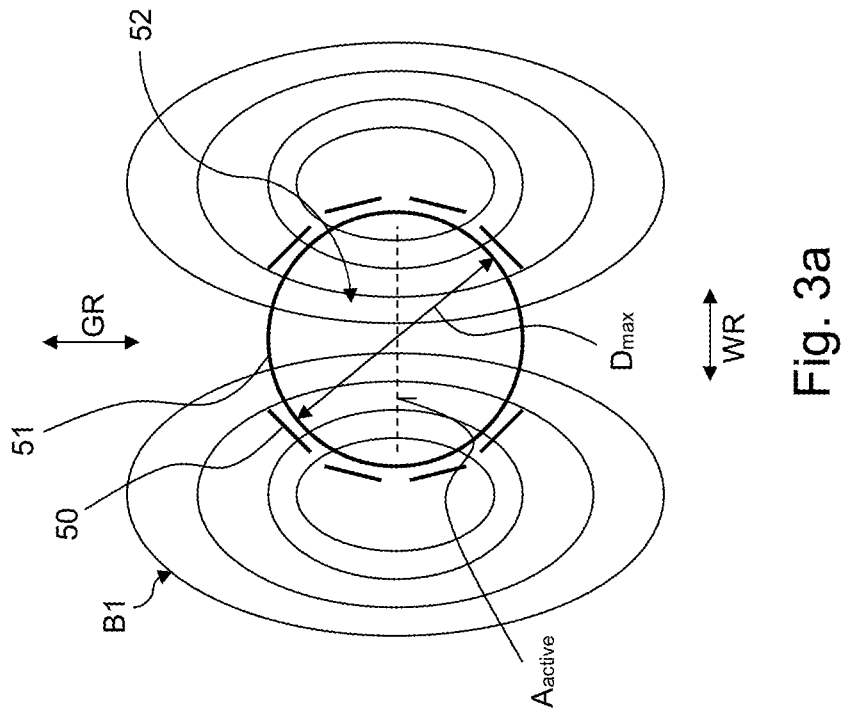

FIGS. 3a and 3b illustrate the concentration of the time-varying magnetic flux (or B1 field) in the RF coil 50 of an NMR probe head, with FIG. 3a being without the additional element, and FIG. 3b being with the additional element according to the invention, in each case in cross section perpendicular to the transverse direction.

As can be seen in FIG. 3a, the RF coil 50 generates a time-varying magnetic field B1 in the area of a sample receptacle 51 with a circular cylindrical cross section. A circular cylindrical body (e.g. a conventional sample tube) with a maximum diameter $D_{max}$ can be accommodated in the sample receptacle 51. Typically, $D_{max}$ is 5 mm. The RF coil 50 has an active volume 52 with a cross-sectional area $A_{active}$ (measured in the plane perpendicular to the base direction GR), which extends substantially across the width of the sample receptacle 51. The distribution of the B1 field within the RF coil 50 or the active volume 52 without additional element is substantially homogeneous.

By introducing the additional element 1 into the sample receptacle 51, as shown in FIG. 3a, the B1 field is displaced from the area of the cover zone 5 and largely focused into the passage window 2 (in practice, a certain part of the B1 field is also displaced from the area of the cover zone 5 and directed past the additional element 1 on the outside, not shown in detail). According to the invention, $A_{cover} \geq 0.2*A_{active}$, and here approx. $A_{cover}=0.7*A_{active}$. In this respect, the additional element 1 acts as a Lenz lens.

If the test sample (not shown in detail) is positioned in the area of the passage window 2, an associated NMR measurement can be carried out with a correspondingly amplified B1 field and therefore an improved signal-to-noise ratio.

Note that in the schematic representation of FIG. 3, the exact position of field lines of the B1 field with respect to the subsections of the illustrated RF coil 50 has not been worked out in more detail for the sake of simplicity.

Figures 4A, 4B, 4C, 4D:
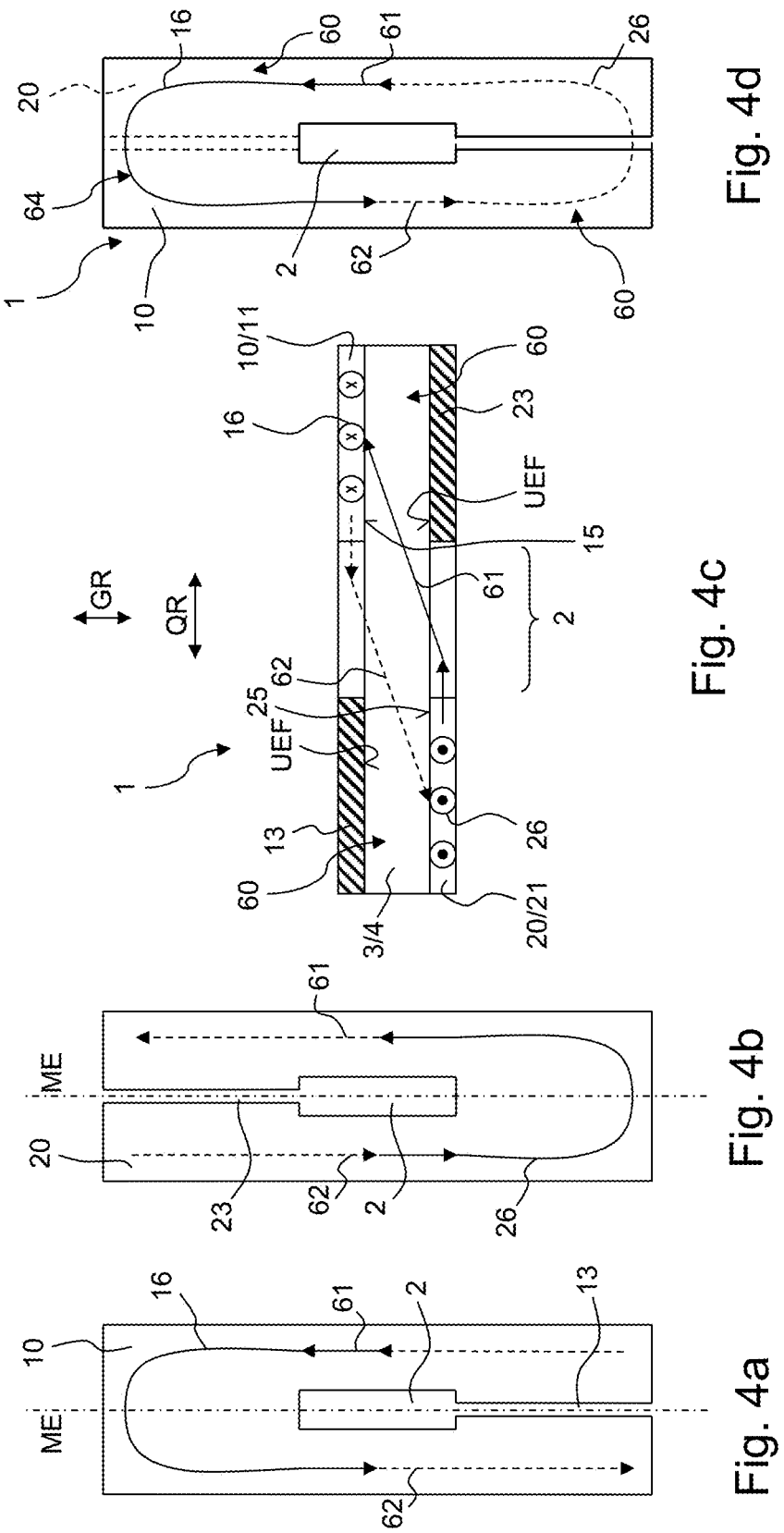
FIGS. 4a-4d schematically show a circulating current resulting at natural resonance in the additional element of the embodiment of FIGS. 1a-1f.

However, the additional element 1 according to the invention not only acts as a Lenz lens for field concentration, but also forms a resonant circuit that couples to the RF coil of the NMR probe head. FIGS. 4a-4d illustrate the formation of the resonant circuit for the additional element 1 of FIG. 1a. FIG. 4a shows a top view (plan view against the base direction of FIG. 1a) of the cover element 10, FIG. 4b shows a top view of the cover element 20, FIG. 4c shows a longitudinal section along the transverse direction QR (and along the base direction GR), and FIG. 4d shows a top view/projection of the entire additional element 1, wherein the additional element 10 lies above the additional element 20, which is located there beneath and is indicated by dashed lines.

For the formation of the resonant circuit in the additional element, it is preferred within the scope of the invention if a closed (alternating) circulating current is formed around the passage window 2. In the cover element 10 of the first sandwich plane 11, a fully ohmic conductor path around the entire passage window 2 is not possible, as the interruption gap 13 in the front part blocks the ohmic current flow. Conversely, a fully ohmic conductor path around the entire passage window 2 is not possible in the cover element 20 of the second sandwich plane 21, as the interruption gap 23 in the rear part blocks the ohmic current flow.

However, cover elements 10, 20 which are mutually opposing in the (first) sandwich SW1 form opposing and overlapping coupling surfaces 15, 25 through which an alternating current corresponding to a surface capacitor can pass over. A first passover takes place on the right-hand side of the central plane ME (circulating current part 61), and a further passover takes place on the right-hand side of the central plane ME (circulating current part 62), in each case distributed over the full length of the additional element in the transverse direction QR. An overlapping area UEF is available for this purpose, which in this case corresponds to half the area (left or right) of an individual cover element 10, 20. A surface capacitor formed in this manner in each case represents a capacitively acting structure 60.

As a result, a circulating current 64 of an alternating current can form, which can use an ohmic current path in the cover element 10 in the rear part (circulating current part 16), which can use an ohmic current path in the cover element 20 in the front part (circulating current part 26), and which can, distributed over the two overlapping surfaces UEF, pass over the capacitively acting structures 60 between the cover elements 10, 20 (circulating current part 61 on the right, circulating current part 62 on the left). The complete circulating current 64 around the passage window 2 can be clearly seen in the overall representation of FIG. 4d, where circulating current parts/structures below the drawing plane are shown as dashed lines. It should be noted that the circulating current 64 has substantially the same current intensity everywhere and also has no current nodes (branches or confluences of electrical current). The circulating current 64 changes the sandwich plane 11, 21 twice during one revolution around the passage window 2, corresponding to two capacitively acting structures 60.

This forms a resonant circuit that can be excited by a B1 field parallel to the base direction GR and that can couple with the measuring resonant circuit of the RF resonator in the NMR probe head. The resonant circuit comprises the capacitively acting structures 60, which altogether cause a capacitance C, and, since the alternating current flows around the passage window 2, also a structure which causes an inductance L (LC resonant circuit). In the scope of the invention, the resonant circuit formed by the additional element has a resonance frequency RF, with 5 MHz≤RF≤3000 MHz, whereby a good and suitable coupling with the measuring resonant circuit of the NMR probe head can be achieved (see also FIGS. 5a-5d).

It should be noted that a field concentration (cf. FIGS. 3a, 3b) and the formation of a resonant circuit (cf. FIGS. 4a-4d) can also be achieved with the further embodiments shown in an analogous manner and in accordance with the invention.

FIGS. 5a-5d illustrate the effects of the additional element when coupling its resonant circuit to the measuring resonant circuit of an NMR probe head within the scope of the invention. In the figures, the frequency (f) is along the horizontal axis and the absorption (abs) of the RF resonator of the NMR probe head is along the vertical axis, in each case in arbitrary units ("resonance curves").

Figure 5C:
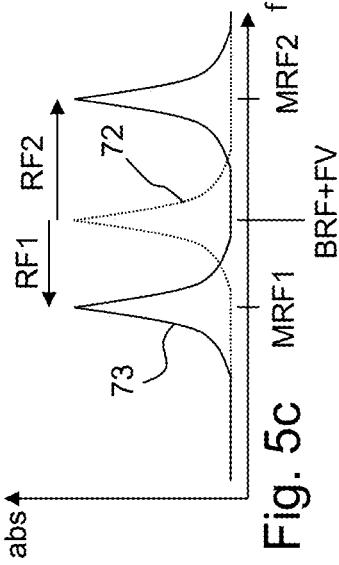
FIGS. 5a-5d schematically show the effects of an additional element within the scope of the invention on the resonance behavior of an RF resonator of an NMR probe head, in diagrams with frequency indicated by the horizontal axis and the absorption of the RF resonator ("resonance curve") indicated by the vertical axis, in each case in arbitrary units.
Figure 5D:
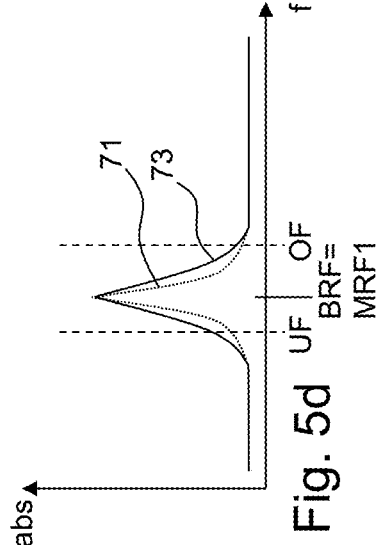
Figure 5A:
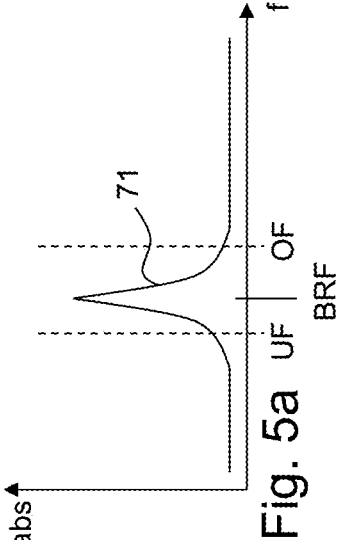

FIG. 5a first shows the resonance curve 71 of the RF resonator of the NMR probe head without additional element. The resonance curve 71 has a maximum at the base resonance frequency BRF (natural resonance of the measuring resonant circuit). The RF resonator can be slightly detuned between a lower frequency UF and an upper frequency OF by a tuning device in the NMR probe head (e.g. to adapt to extreme sample properties or magnetic drift), and BRF lies between UF and OF.

Figure 5B:
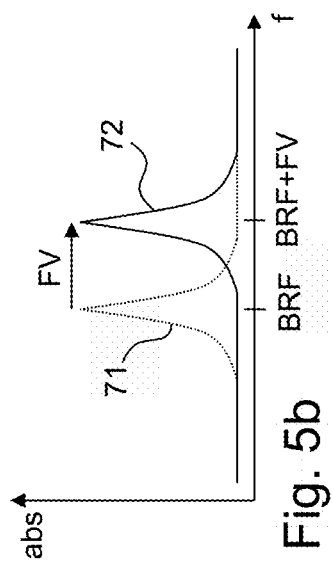

If an additional element, which acts as a Lenz lens, is now introduced into the sample receptacle of the NMR probe head, cf. FIG. 5b, a frequency shift FV of the resonance frequency of the measuring resonant circuit occurs due to field displacement, or more precisely, a frequency increase. The new resonance curve 72 has a new resonance frequency that lies at BRF+FV.

If the additional element according to the invention also forms a resonant circuit which couples to the RF coil or the measuring resonant circuit, the natural resonance of the measuring resonant circuit is also split into two modes, cf. the resonance curve 73 in FIG. 5c. The lower mode has a resonance frequency reduced by RF1, and correspondingly a mode resonance frequency MRF1=BRF+FV−RF1. The upper mode has a resonance frequency increased by RF2, and correspondingly a mode resonance frequency MRF2=BRF+FV+RF2. It should be noted that FV, RF1 and RF2 are always assumed to be positive here.

In the illustrated example, the resonance frequency of the resonant circuit of the additional element and the coupling to the RF resonator of the NMR probe head are set up such that MRF1 again corresponds exactly to BRF, as represented in FIG. 5d, which now shows the resonance curve 73 only in the range of the lower mode. The upper mode is not used for the invention. An NMR measurement can be carried out with the lower mode. In preparation, the (coupled) RF resonator of the NMR probe head can be tuned to the specific test sample and the desired atomic nucleus in the usual way. The aforementioned tuning device can perform tuning within the frequencies UF to OF. Accordingly, in the scope of the invention, the frequency shift FV due to field displacement does not impair the usefulness of the NMR probe head with regard to tunability, since FV is compensated by RF1. In FIG. 5d, the resonance curve 73 of the lower mode is represented with a slightly broadened peak compared to the original resonance curve 71 to indicate a slightly deteriorated quality factor due to the additional element.

Figure 7:
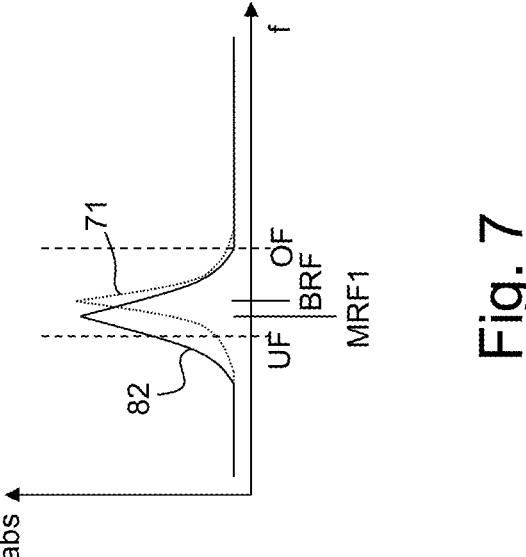
FIG. 7 shows, analogous to FIG. 5d, the resulting resonance curve of the lower mode compared to the resonance curve without additional element, wherein MRF1<BRF, within the scope of the invention.
Figure 6:
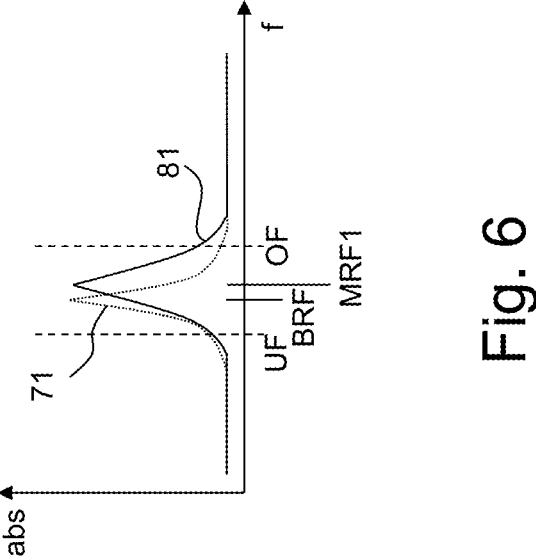
FIG. 6 shows, analogous to FIG. 5d, the resulting resonance curve of the lower mode compared to the resonance curve without additional element, wherein MRF1>BRF, within the scope of the invention.

Preferably (and as represented in FIG. 5d), the natural resonance of the additional element and its coupling are set up such that MRF1=BRF, or in other words FV=RF1. In practice, it is already sufficient for the invention that the frequency shift FV due to the field displacement on the one hand and the frequency reduction RF1 of the lower mode compared to the uncoupled resonance frequency cancel each other out to such an extent that the mode resonance frequency MRF1 remains in the tunable range of the NMR probe head, as can be seen in FIG. 6 and FIG. 7. It should be noted here that the object of the additional element is to measure samples with a significantly reduced volume compared to the sample space volume of the NMR measuring head.

Even highly lossy test samples or those with a high dielectric constant only lead to minor changes in the tuning of the measuring head due to their small volume, so that the full tuning range from UF to OF is usually not necessary in order to achieve optimum tuning with all relevant test samples.

FIG. 6 illustrates a resonance curve 81 of the resulting lower mode, in which MRF1 is slightly greater than BRF, and correspondingly FV>RF1. As long as BRF−UF>FV−RF1, MRF1 can still be shifted back to the previous BRF with the tuning device, and measurements that were possible without the additional element at the basic resonance frequency are also possible with the additional element with the existing equipment.

Preferably, BRF−UF>FV−RF1+(OF−UF)/5 also applies, so that it is still possible to compensate for extreme sample properties and/or frequency changes to compensate for magnetic drift to a certain extent.

FIG. 7 illustrates a resonance curve 82 of the resulting lower mode, in which MRF1 is slightly smaller than BRF, and correspondingly FV<RF1. As long as OF−BRF>RF1−FV, MRF1 can still be shifted back to the previous BRF with the tuning device, and measurements that were possible without the additional element at the basic resonance frequency are also possible with the additional element with the existing equipment.

Preferably, OF−BRF>RF1−FV+(OF−UF)/5 also applies, so that it is still possible to compensate for extreme sample properties and/or frequency changes to compensate for magnetic drift to a certain extent.

Here is a typical example according to the invention: The NMR probe head has a base resonance frequency BRF of 600 MHz, and can be tuned with an existing tuning device between UF=590 MHz and OF=610 MHz (in each case without an additional element) (Note that UF and OF need not be symmetrical about BRF, usually BRF−UF>OF−BRF). By coupling with an additional element according to the invention with a resonance frequency RF of 1200 MHz, with a coupling factor of 0.75, and furthermore an inductance of the additional element of ⅓ of the inductance of the RF coil of the probe head, a resonance frequency reduction RF1 for the lower mode of 40 MHz is achieved. At the same time, the additional element generates a frequency shift FV (increase in resonance frequency) of approx. 45 MHz due to field displacement. Then MRF1=BRF+FV−RF1 is at 605 MHz. This can be easily tuned with the existing tuning device of the probe head, i.e. can be traced back to 600 MHz, since BRF−UF=10 MHz, and is furthermore merely RF−FV=5 MHz, i.e. BRF−UF>RE1−FV. There are even 5 MHz left as a further tuning reserve, which is more than (OF−UF)/5=4 MHz.

Figures 8A, 8B, 8C:
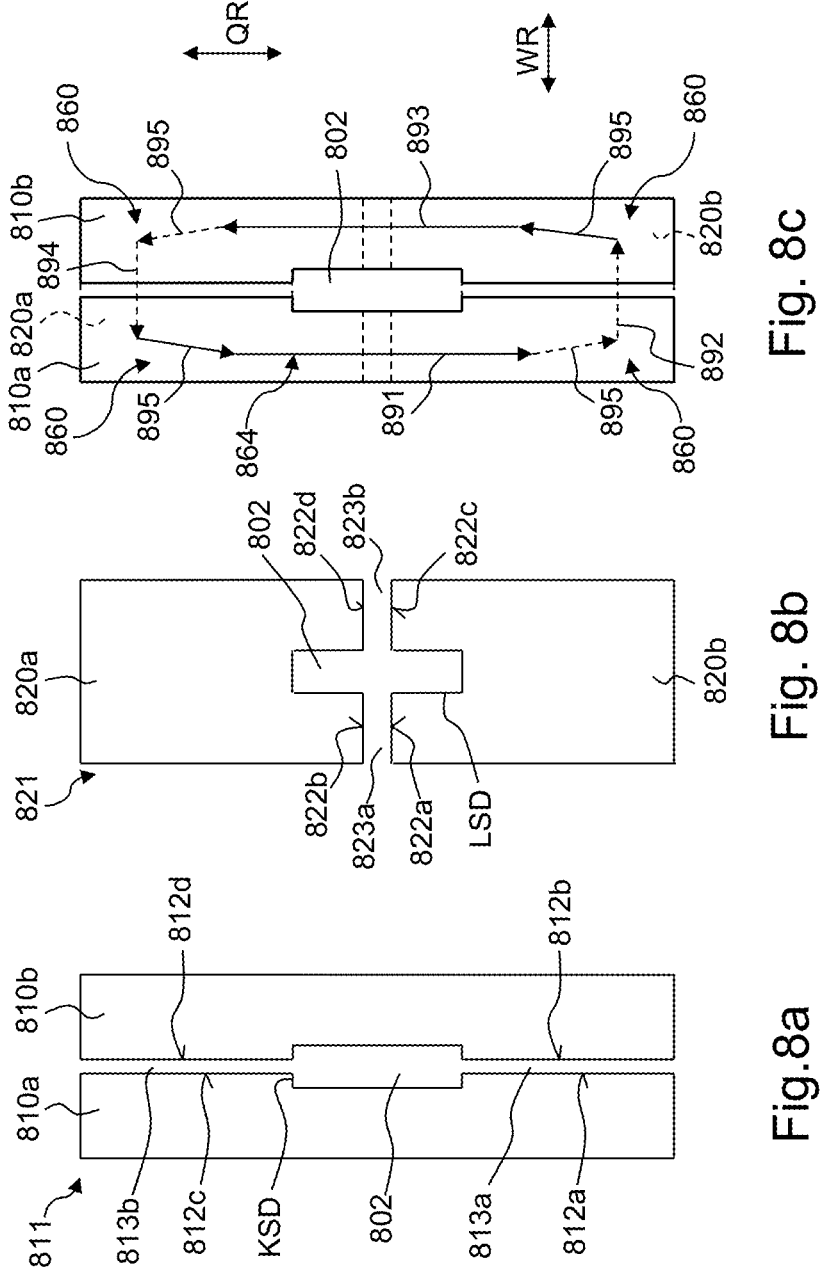
FIGS. 8a-8c schematically show a second embodiment of an additional element according to the invention, comprising a first sandwich of cover elements.

FIGS. 8a-8c illustrate a second embodiment of an additional element 801 according to the invention, similar to the additional element of FIG. 1a. Only the main differences are explained.

The additional element 801 of the second embodiment has two cover elements 810a, 810b in the first sandwich plane 811, and two cover elements 820a, 820b in the second sandwich plane 821. A layer of a dielectric is arranged between the cover elements 810a, 810b, 820a, 820b of the two sandwich planes 811, 821 (not shown in more detail, but cf. e.g. FIG. 1a.

FIG. 8a shows the top view (plan view along the base direction) of the cover elements 810a, 810b of the first sandwich plane 811, FIG. 8b shows a top view of the cover elements 820a, 820b of the second sandwich plane 821, and FIG. 8c shows an overall view of the additional element 801 in top view/projection.

The cover elements 810a, 810b are approximately C-shaped, and each encompasses about half of the passage window 802 (810 left half, 810b right half). An interruption gap 813a is located between the opposite ends 812a, 812b, and an interruption gap 813b is located between the opposite ends 812c, 812d. The interruption gaps 813a, 813b are located centrally on the short side KSD of the passage window 802 and run along the transverse direction QR.

The cover elements 820a, 820b are also approximately C-shaped, and each encompasses about the half of the passage window 802 (820a rear half, 820b front half). An interruption gap 823a is located between the opposite ends 822a, 822b, and an interruption gap 823b is located between the opposite ends 822c, 822d. The interruption gaps 823a, 823b are located centrally on the long side LSD of the passage window 802 and run along the further direction WR.

Accordingly, the interruption gaps 813a, 813b of the first sandwich plane 811 are offset relative to the interruption gaps 823a, 823b of the second sandwich plane 821 in a circumferential direction around the passage window 802, in this case by 90° in each case.

To set up a resonant circuit, this structure enables a total (alternating) circulating current 864 around the passage window 802, with ohmic circulating current part 891 in cover element 810a, ohmic circulating current part 892 in cover element 820b, ohmic circulating current part 893 in cover element 810b, and ohmic circulating current part 894 in cover element 820a, as well as four circulating current parts 895, which are each set up by a passover of alternating current through the capacitively acting structures 860 of the surface capacitors arranged between the sandwich planes.

The entire circulating current 864 therefore changes the sandwich plane 811, 821 four times in one revolution. The quadrants at the front left, front right, rear right and rear left each form a capacitively acting structure 860 in the manner of a surface capacitor, with a respective area UEB corresponding to approximately ½ of an associated individual cover element 810a, 810b, 820a, 820b.

Figures 9B, 9C, 9D, 9E:
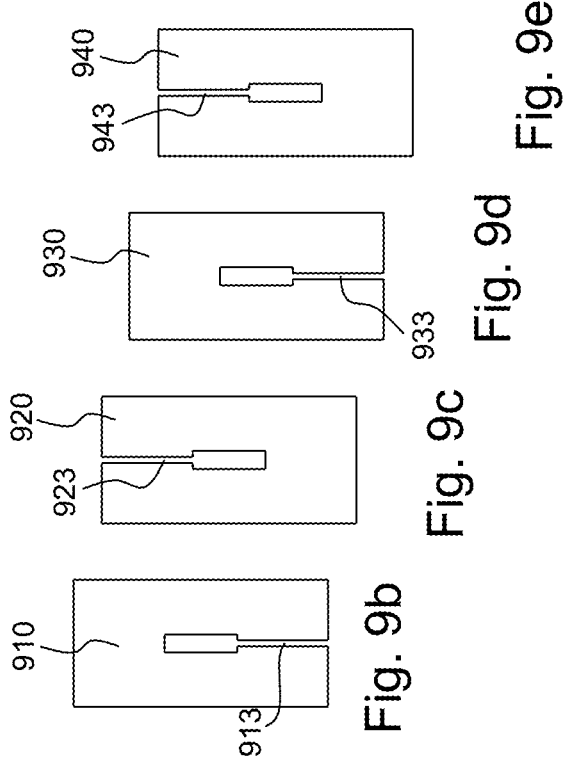
FIGS. 9a-9e schematically show a third embodiment of an additional element according to the invention, comprising a first sandwich of cover elements and a second sandwich of cover elements.
Figure 9A:
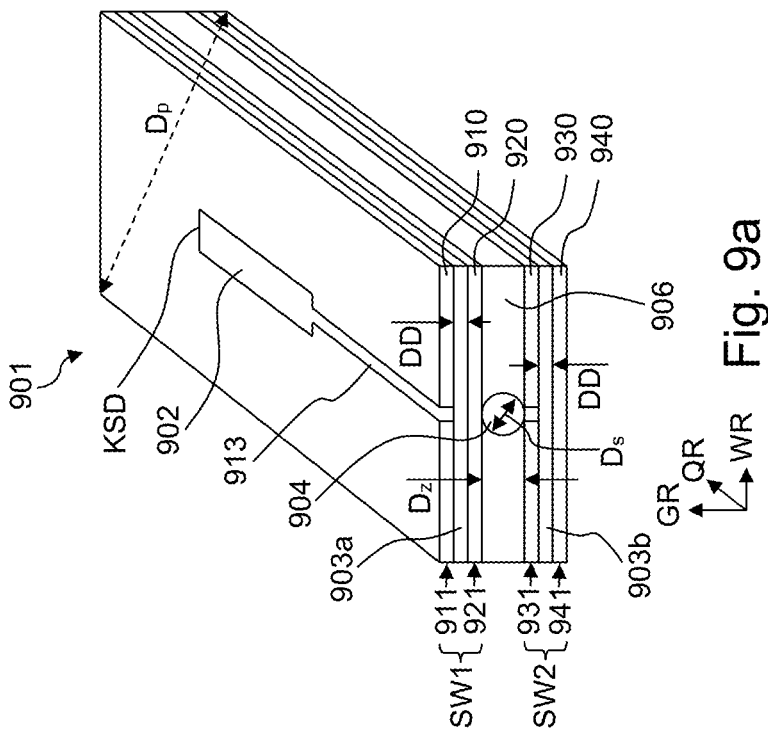

FIGS. 9a-9e show a third embodiment of an additional element 901 according to the invention, similar to that shown in FIG. 1a. Only the main differences are explained. FIG. 9a shows an oblique view, FIG. 9b shows a top view (plan view along the base direction, in each case from above) of cover element 910, FIG. 9c shows a top view of cover element 921, FIG. 9d shows a top view of cover element 930, and FIG. 9e shows a top view of cover element 940.

The additional element 901 comprises here a first sandwich SW1 of cover elements 910, 920 in the sandwich planes 911, 921, and a second sandwich SW2 of cover elements 930, 940 in the sandwich planes 931, 941. The first sandwich plane 911 contains the cover element 910, and the second sandwich plane 921 contains the cover element 921. Furthermore, the sandwich plane 931 contains the cover element 930, and the fourth sandwich plane 941 contains the cover element 940. The cover elements 910, 920, 930, 940 are designed to be each C-shaped and encompass the passage window 902 almost completely, except for a respective interruption gap 913, 923, 934, 944, which is each located on a short side KSD of the passage window 902. Within a respective sandwich SW1, SW2, the interruption gaps 913, 923 and 933, 943 are located opposite one another. In addition, the interruption gaps of the central cover elements 921, 931, which face each other, are opposite one another.

Between the cover elements 910, 920 in the first sandwich SW1 is a layer 903a of a dielectric with layer thickness DD. In addition, a layer 903b of a dielectric (here also with layer thickness DD) is located between the cover elements 930, 940 in the second sandwich SW2. Finally, a layer 906 of a dielectric with a thickness $D_z$ is located between the cover elements 920, 930.

The layer 906 here also contains the sample channel 904 with diameter $D_s$, which extends in the transverse direction QR, wherein here $D_s=D_z$. The additional element 1 has a maximum outer diameter $D_p$. In the embodiment shown, DD is approx. 0.15 mm, $D_s$ is approx. 0.4 mm, $D_z$ is approx. 0.4 mm, and $D_p$ is approx. 4 mm.

With the additional element 901 of the third embodiment, a particularly high total capacitance C of the resonant circuit of the additional element 901 can be achieved, and thus also a comparatively low resonance frequency RF.

Furthermore, a corresponding embodiment with $D_s<D_z$ allows a sample channel to be integrated that exhibits no interference with the conductor elements and is therefore particularly easy to manufacture.

Figure 10:
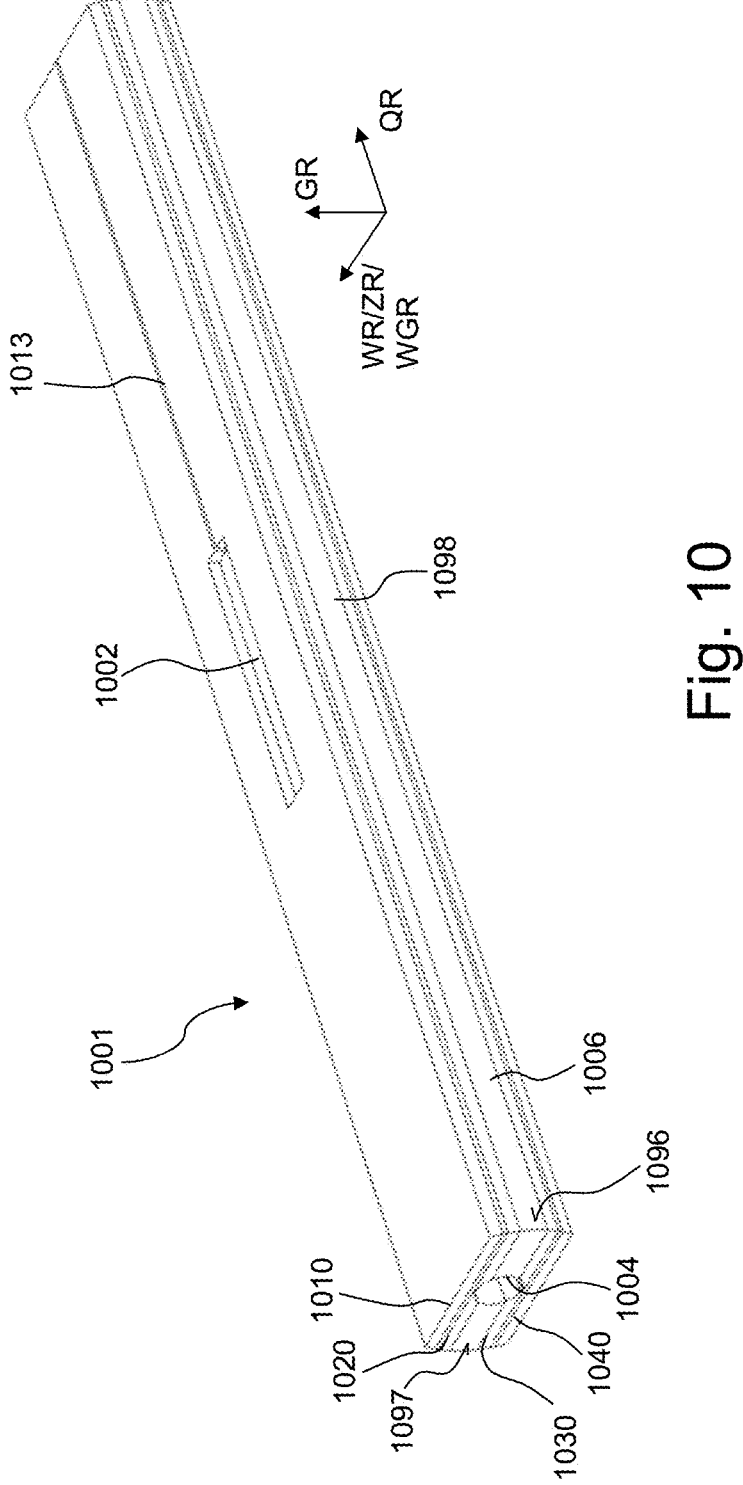
FIG. 10 schematically shows a fourth embodiment of an additional element according to the invention, comprising a first sandwich of cover elements and a second sandwich of cover elements similar to that shown in FIG. 9, in oblique view, with rounded sides.

FIG. 10 schematically shows a fourth embodiment of an additional element 1001 for the invention, in an oblique view.

The embodiment of FIG. 10 largely corresponds to the embodiment of FIGS. 9*a*-9*e*; however, here the interruption gaps of the cover elements 1010 and 1040 are located in the rear/upper part of the additional element 1001 in FIG. 10 (lying in the direction of QR, cf. reference sign 1013 for cover element 1010, the other interruption gap of cover element 1040 is concealed), and the interruption gaps of cover elements 1020, 1030 are located in the front/bottom part of additional element 1001 in FIG. 10 (lying in the opposing direction to direction Q, concealed in each case). This avoids additional capacitance between the cover elements 1020, 1030, as their potentials are substantially the same. In addition, the sample space 1004 extends into the cover elements 1020, 1030 across part of their height. Furthermore, the side edges 1096, 1097 of the additional element 1001 are rounded to facilitate insertion into a glass tube or directly into the circular cylindrical opening of an NMR measuring head (cf. also FIG. 11).

The additional element 1001 is operated in the conventional orientation with a B1 field along the base direction GR so that the associated B1 field passes through the passage window 1002 in a focused manner and irradiates a test sample located there. The B0 field lies along the transverse direction QR.

The comparatively thick layer 1006 of the dielectric between the cover elements 1020, 1030 (and also the comparatively low overall height of the additional element 1001 in the base direction GR) ensures that a further time-varying magnetic flux ("further B1 field") irradiated along a second direction ZR would be attenuated only slightly on the test sample, in particular by less than 20%. This second direction ZR is perpendicular to the base direction GR and perpendicular to the cross direction QR; the second direction ZR thus corresponds to the further direction WR. The space between the cover elements 1020, 1030 can be understood as a passage gap 1098 for the further B1 field, which is filled with a dielectric. This embodiment is therefore also suitable for measuring two different atomic nuclei in orientations rotated at 90° to one another; the second direction ZR then corresponds to a further base direction WGR. However, no noticeable B1 field concentration is achieved here with regard to the further base direction WGR (but cf. FIGS. 20*a*, 21*a* in this regard).

Figures 11, 12, 13:
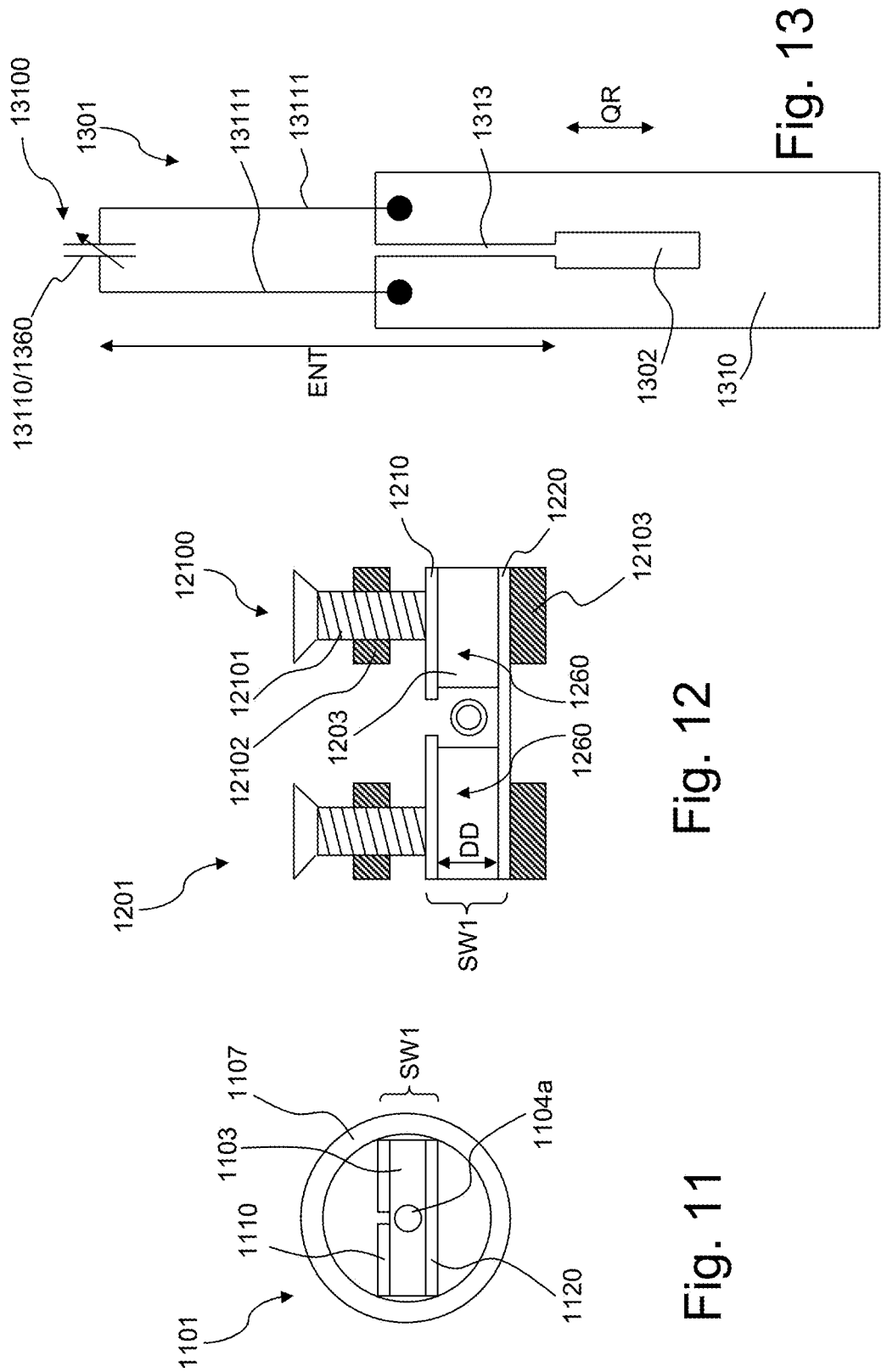
FIG. 11 schematically shows a fifth embodiment of an additional element according to the invention, comprising a glass tube containing the cover elements, in cross section.
FIG. 12 schematically shows a sixth embodiment of an additional element according to the invention, comprising a tuning element with which a thickness of the layer of a dielectric can be changed.
FIG. 13 schematically shows a seventh embodiment of an additional element according to the invention, comprising a tuning element which comprises a trimmer capacitor.

FIG. 11 shows a schematic cross section of a fifth embodiment of an additional element 1101 according to the invention. The additional element 1101 comprises here a (first) sandwich SW1 of the cover elements 1110, 1120 with an intermediate layer 1103 of a dielectric, similar to that shown in FIG. 1*a*. The additional element 1101 further comprises a (circular) cylindrical glass tube 1107. The sandwich SW1 is arranged in the glass tube 1107, in particular clamped or glued in (not shown in detail). The additional element 1101 can then be handled in the same way as a conventional sample tube, for example gripped and moved using existing transport systems, and inserted into the sample receptacle of a conventional NMR probe head.

In the exemplary embodiment shown, a sample channel 1104*a* is formed in the center of layer 1103; said sample channel is completely surrounded by dielectric of layer 1103, and, correspondingly, is closed or sealed all around (over the length of the sandwich SW1), in particular also in the area of the passage window. A liquid test sample can therefore be filled directly into the sample channel 1104*a*.

FIG. 12 shows a schematic cross section of a sixth embodiment of an additional element 1201 for the invention.

The additional element 1201 comprises here a (first) sandwich SW1 of the cover elements 1210, 1220 with an intermediate layer 1203 of a dielectric, similar to that shown in FIG. 1*a*. Furthermore, the additional element 1201 comprises a tuning element 12100, with which the thickness DD of the layer 1203 of the dielectric can be changed, and thus the resonance frequency of the resonant circuit set up by the additional element 1. For this purpose, the tuning element 12100 has a plurality of screws 12101 with an external thread, which can be screwed in and out of bearings 1210 with an internal thread (fixed in a manner not shown in detail). A foot end of a respective screw 12101 rests on the top of the cover element 1210. The underside of the cover element 1220 rests on counter bearings 12103 (fixed in a manner not shown in detail).

When the screws 12101 are screwed further into the bearings 12102, the sandwich SW1 is elastically compressed and the thickness DD of layer 1203 is reduced. This increases the capacitance of the capacitive acting structures 1260 (surface capacitors between the cover elements 1210, 1220), which lowers the resonance frequency of the resonant circuit. Conversely, the capacitance can be reduced by unscrewing the screws 12101 further from the bearings 12102 if the sandwich SW1 relaxes elastically in the process.

It should be noted that the screws 12101 should be at a sufficient distance (typically 5 mm or more) in the transverse direction from the passage window in order to minimize field distortions.

FIG. 13 schematically shows a seventh embodiment of an additional element 1301 for the invention, which here comprises a C-shaped cover element 1310 with an interruption gap 1313 (cf. FIG. 1*a* for this). The additional element can also contain cover elements not shown in more detail in a first sandwich or also a second sandwich (not shown in more detail).

The additional element 1301 is provided with a tuning element 13100, which is designed here as a trimmer capacitor 13110. The trimmer capacitor 13110 is connected by means of supply lines 13111, which are soldered here to a rear end of the cover element 1310 on both sides of the interruption gap 1313. The trimmer capacitor 13110 thus allows an (alternating) circulating current, which is to flow around the passage window 1302 in a closed circuit, to overcome the interruption gap 1313. The trimmer capacitor 13110 is arranged in the transverse direction QR at a distance ENT from the passage window 1302, wherein ENT≥5 mm. This allows field inhomogeneities in the area of the passage window 1302 to be minimized.

Figure 14:
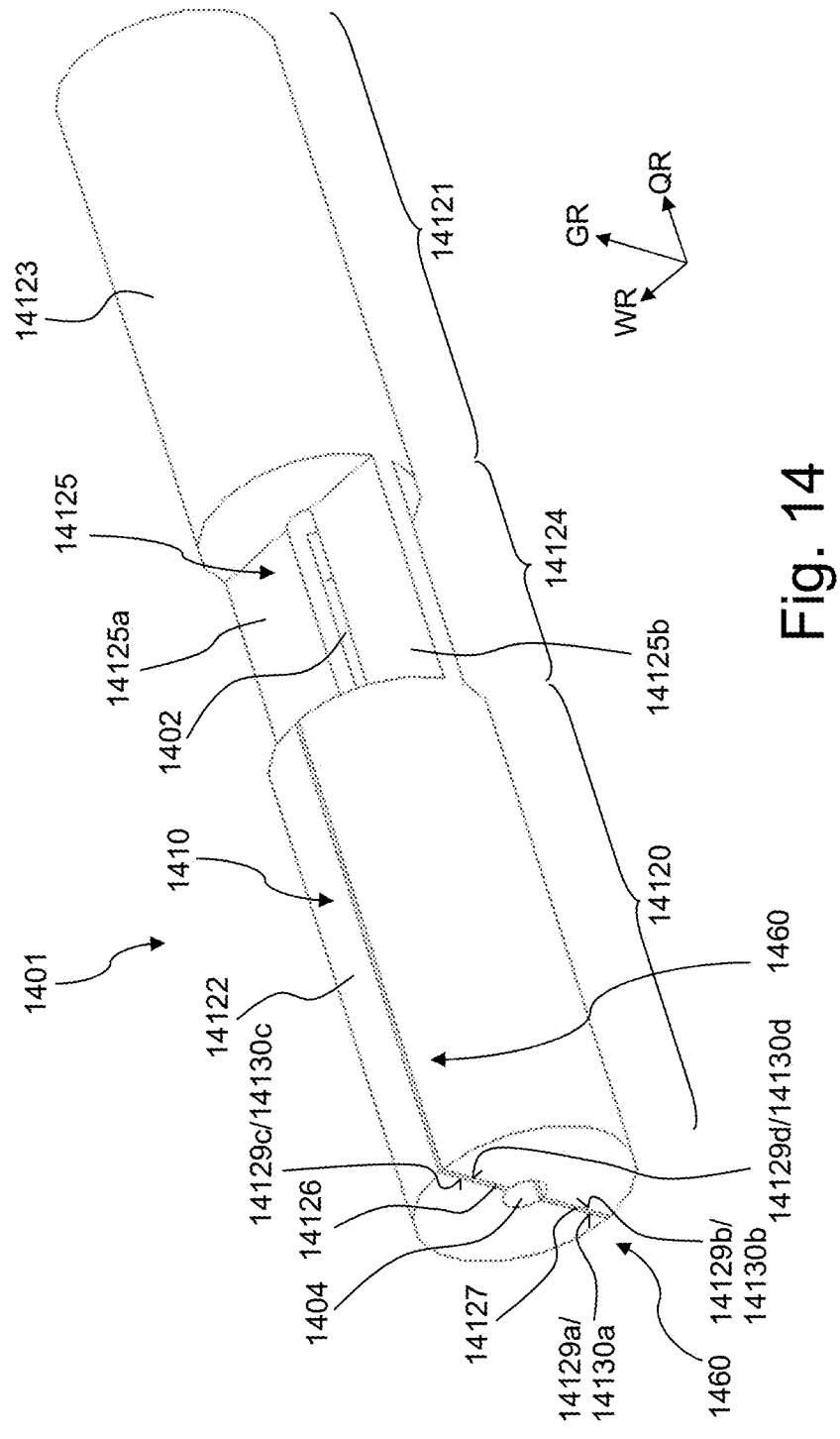
FIG. 14 schematically shows an eighth embodiment of an additional element according to the invention, with metal cylinders at end portions and a metal plate as connecting portion, wherein the front end portion has an upper slot and lower slot.

FIG. 14 illustrates an eighth embodiment of an additional element 1401 for the invention in a schematic oblique view.

This additional element 1401 is substantially dumbbell-shaped and comprises a front end portion 14120 and a rear end portion 14121, which are each structured as metal cylinders 14122, 14123. A connecting portion 14124 is formed with a metal plate 14125 that runs perpendicular to the base direction GR. The metal plate 14125 connects the two metal cylinders 14122, 14123. The passage window 1402 is formed in the metal plate 14125, whereby the metal plate 14125 is divided into two plate parts 14125*a*, 14125*b* and electrically subdivided accordingly. The plate parts 14125*a*, 14125*b* are located to the left and right of the passage window 1402. The additional element 1401 is traversed by a sample space 1404, which runs as a bore in the transverse direction QR centrally through the metal cylinders 14122, 14123 and the metal plate 14125 and intersects the passage window 1402. In the application, a static B0 field is applied along the transverse direction QR (also referred to as the z-direction) and a time-varying B1 field along the base direction GR.

An upper slot 14126 and a lower slot 14127 are formed in the metal cylinder 14122 of the front end portion 14120. Both slots 14126, 14127 run in a plane spanned by the base direction GR and the transverse direction QR, in each case from the sample space 1404 to an outer side of the metal cylinder 14122 in the radial direction, wherein the slot 14126 runs upwards and the slot 14127 runs downwards. A layer of a dielectric is arranged in the slots 14126, 14127.

The additional element 1401 here comprises only a single, one-piece cover element 1410. The cover element 1410 covers a cover zone that corresponds to the projection of the cover element 1410 in the plane perpendicular to the base direction GR (excluding the area of passage window 1402 and slots 14126, 14127) (cover zone not marked in more detail).

The two slots 14126, 14127 each form a capacitive structure 60 in the manner of a surface capacitor, in that coupling surfaces 14130*a*, 14130*b* and 14130*c*, 14130*d* of the additional element 1401 are located opposite one another at the opposite ends 14129*a*, 14129*b* and 14129*c*, 14129*d* respectively. The associated respective overlapping area UEF corresponds in each case to approximately half the cross section of the metal cylinder 14122.

In a plan view along the base direction GR, i.e. in the plane spanned by the transverse direction and the further direction WR, an (alternating) circulating current can flow around passage window 1402, namely as an ohmic current from the rear metal cylinder 14123 via the plate part 14125*a* to the left part of the front metal cylinder 14122, then with a capacitive transfer via slots 14126, 14127 from the left part into the right part of the metal cylinder 14122, and further as an ohmic current from the right part of the front metal cylinder 14122 via the plate part 14125*b* back to the rear metal cylinder 14123. A resonant circuit can form accordingly.

As usual with a Lenz lens, ohmic current flow is not possible all the way around the passage window 1402, as the slots 14126, 14127 (and the sample space 1404) interrupt the ohmic current path. An ohmic closed conductor loop is possible similar to that shown in FIG. 2*a*, wherein the current flows along the slots 14126, 14127.

In the embodiment of the additional element 1401 shown in FIG. 14, it is preferred to use a material for the metal cylinders 14122, 14123 and the metal plate 14125 which does not produce any significant shimming interference (for example aluminum). The additional element 1401 can be manufactured as an insert which has the same shape as a normal glass sample (standard sample tube), which is easy to manufacture (in particular with few manufacturing steps, especially if the dielectric in the gaps 14129 is "air") and which also maximizes the displacement/concentration of magnetic field as there is no additional glass element through which B1 can flow without being displaced/concentrated. If the capacitance of the "air gap" is not sufficient, then the capacitance can be increased, for example, by means of discrete elements (e.g. an additional trimmer capacitor) as shown in FIG. 13 or by "approximation" (elastic compression) as shown in FIG. 12; it is also possible to fill the air gap with a dielectric with a high permittivity (typically with $\varepsilon_r > 2$).

Further embodiments of dumbbell-like or metal cylinder-like basic shapes based on additional elements are explained below. The most important differences to the design shown in FIG. 14 are explained.

Figure 15:
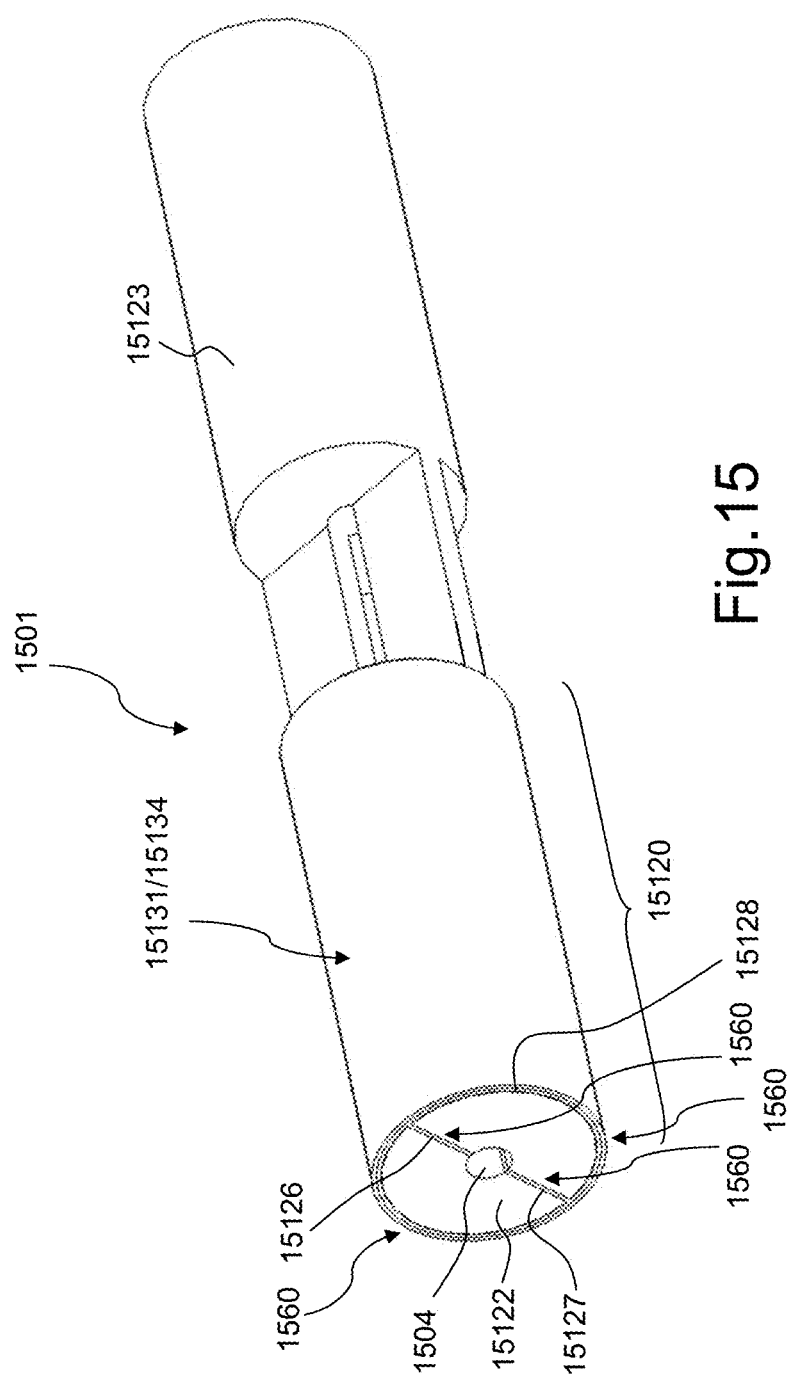
FIG. 15 schematically shows a ninth embodiment of an additional element according to the invention, similar to that shown in FIG. 14, but with a metal tube at the front end portion which overlaps the slots.

The additional element 1501 according to the ninth embodiment of FIG. 15 corresponds largely to the embodiment of FIG. 14, wherein, however, a metal tube 15131 is additionally arranged around the front metal cylinder 15122, and a radial gap 15128 filled with a layer of a dielectric is located between the metal tube 15131 and the front metal cylinder 15122.

Accordingly, the metal tube 15131 overlaps the slots 15126, 15127 on the cylinder outer side of the metal cylinder 15122. This sets up further capacitive structures 60 via which the alternating current can be capacitively transferred from the left part to the right part of the metal cylinder 15122. Accordingly, a higher total capacitance is achieved and a lower resonance frequency of the resonant circuit of the additional element 1501 can be achieved.

Another function of the metal tube 15131 is that it additionally acts as a shielding element 15134 in the front end area 15120, so that a shielding of the sample space 1504 against the B1 field is achieved there, which would otherwise be able to penetrate to a certain extent through the slots 15126, 15127.

Figure 16:
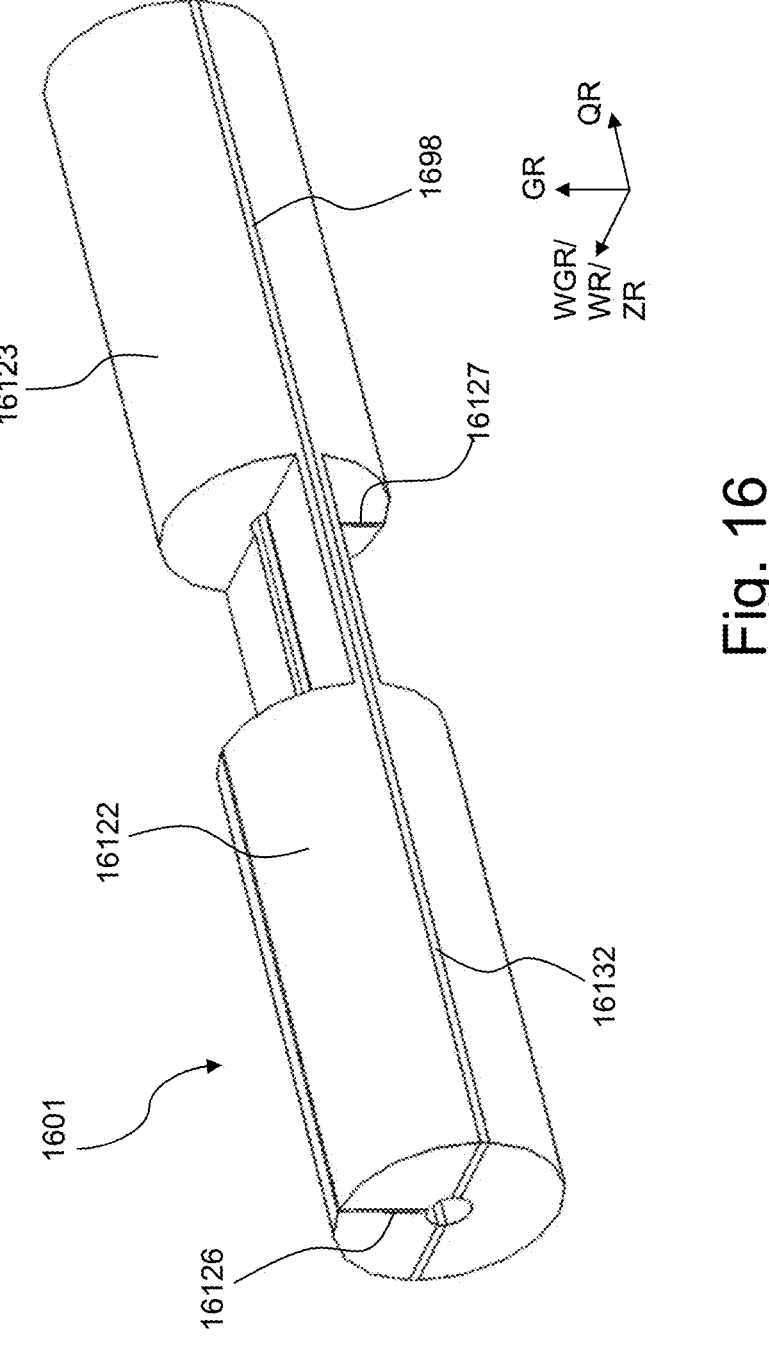
FIG. 16 schematically shows a tenth embodiment of an additional element according to the invention, with metal cylinders at end portions and a metal plate as connecting portion, wherein the front end portion has an upper slot, the rear end portion has a lower slot, and the additional element as a whole has a central slot.

In the tenth embodiment of FIG. 16, the front metal cylinder 16122 has the upper slot 16126, and the rear metal cylinder 16123 has the lower slot 16127. In addition, a central slot 16132 is provided, which runs centrally through the additional element 1601 along a plane spanned by the transverse direction QR and the further direction WR. The central slot 16132 subdivides the metal cylinders 16122, 16123 and also the metal plate 16125, and is filled with a layer of a dielectric.

In this embodiment, (alternating) circulating currents can occur above and below the central slot 16132 as in the embodiment of FIG. 14. In addition, capacitive current transfers similar to those in the embodiment of FIG. 1*a* are also possible, cf. FIG. 4*a* there.

The comparatively wide central slot 16132 can also function as a passage gap 1698, which, together with the free area above and below the metal plate 16125, causes a good transparency for a further time-varying magnetic flux along a second direction ZR, which runs perpendicular to the base direction GR (and perpendicular to the transverse direction QR). This makes this embodiment particularly suitable not only for an NMR measurement in the normal orientation (with B1 field along the base direction GR), but also for a further NMR measurement with an orientation rotated by 90° (with a further B1 field along the second direction ZR, which is then also referred to as a further base direction WGR).

Figure 17:
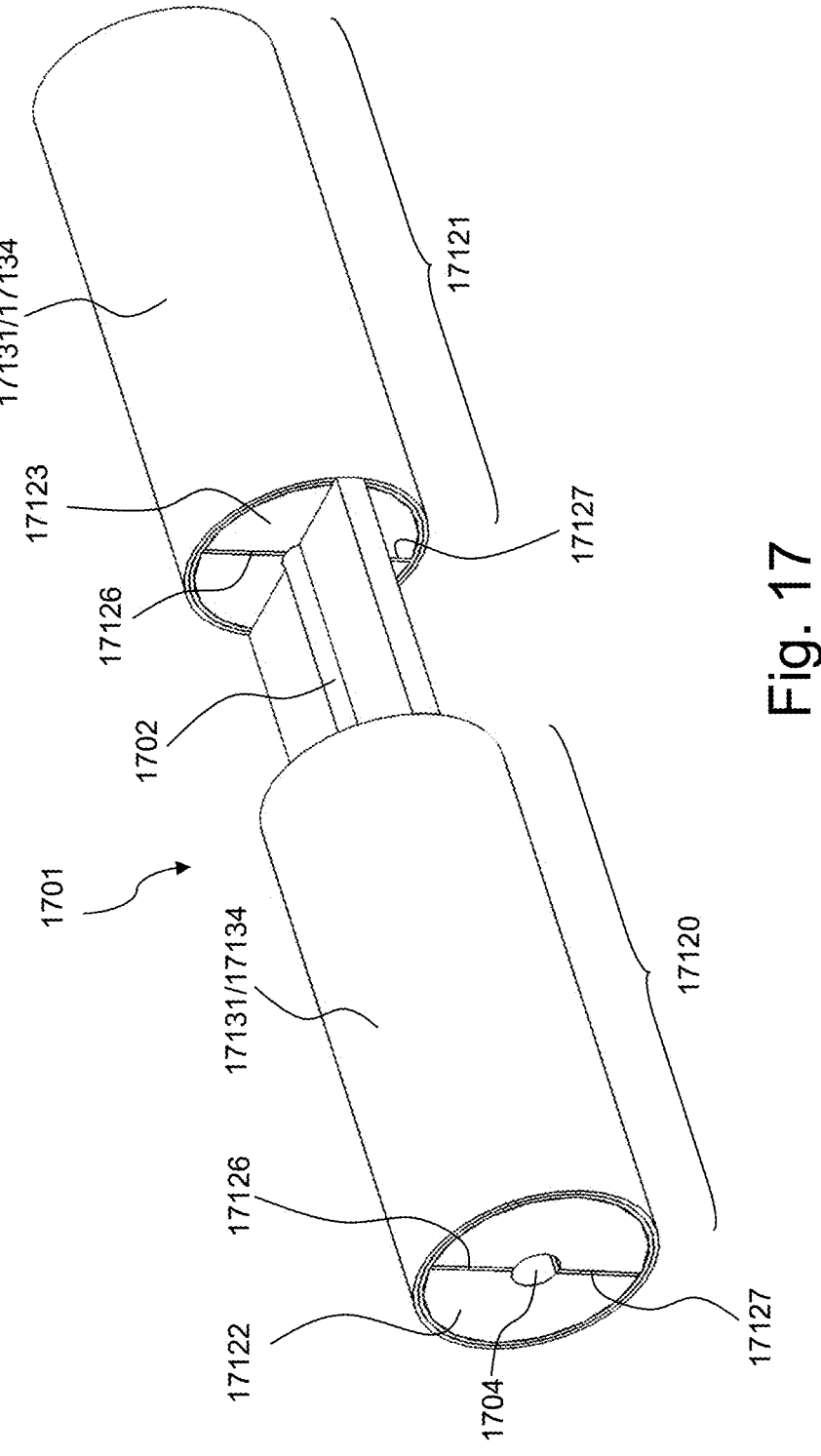
FIG. 17 schematically shows an eleventh embodiment of an additional element according to the invention, with metal cylinders at end portions and a metal plate as connecting portion, wherein the front end portion has an upper slot and a lower slot, the rear end portion has an upper slot and a lower slot, and both end portions each have a metal tube that overlaps the slots.

The eleventh embodiment of an additional element 1701, which is shown in FIG. 17, has an upper slot 17126 and a lower slot 17127 in each of the two metal cylinders 17122, 17123, as well as a surrounding metal tube 17131. (Alternating) circular currents around the passage window 1702 must be transferred capacitively via the slots 17126, 17127 in both the front metal cylinder 17122 and the rear metal cylinder 17123. By connecting two capacitors in series, the natural resonance frequency increases compared to the previous embodiments. Together with the metal tubes 17131, the capacitance can be increased even further so that comparable natural resonance frequencies can be achieved without changing the dielectric constant or the thickness of the dielectrics, despite series connection. In addition, the metal tubes 17131 again additionally act as shielding elements 17134 in the front end portion 17120 and in the rear end portion 17121.

Figure 18:
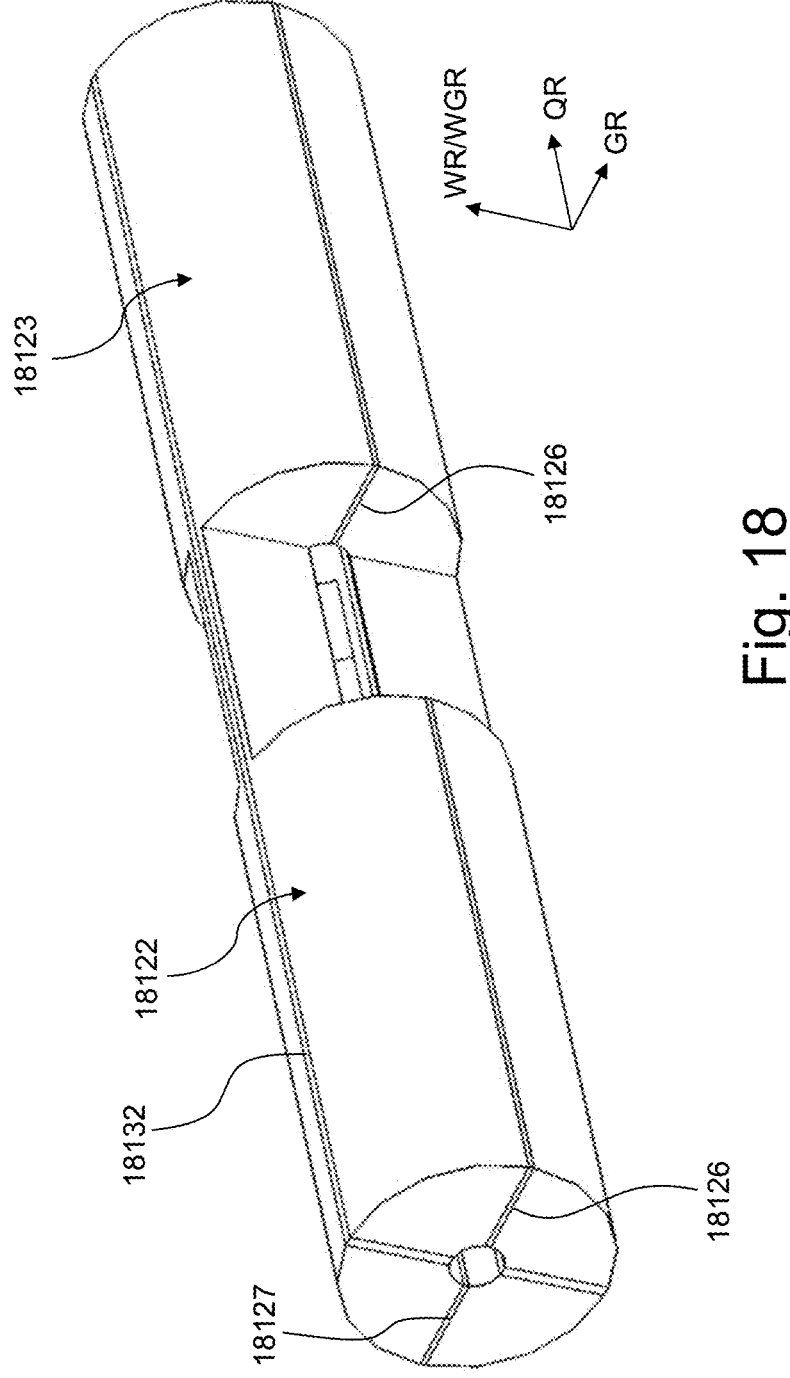
FIG. 18 schematically shows a twelfth embodiment of an additional element according to the invention, with metal cylinders at end portions and a metal plate as connecting portion, wherein the front end portion has an upper slot and a lower slot, the rear end portion has an upper slot and a lower slot, and the additional element as a whole has a central slot.

Two independently adjustable orthogonal modes are achieved with the twelfth embodiment of an additional element 1801 of FIG. 18. Here, an upper slot 18126 and a lower slot 18127 are provided in each of the two metal cylinders 18122, 18123, and a central slot 18132 is also provided. The capacitance formed via the slots 18126, 18127 primarily influences the resonance frequency of the mode whose B1 field is oriented in the base direction GR, whereas the capacitance formed by the central slot 18132 primarily influences the resonance properties of the mode whose B1 field is oriented along the further base direction WGR.

Figure 19:
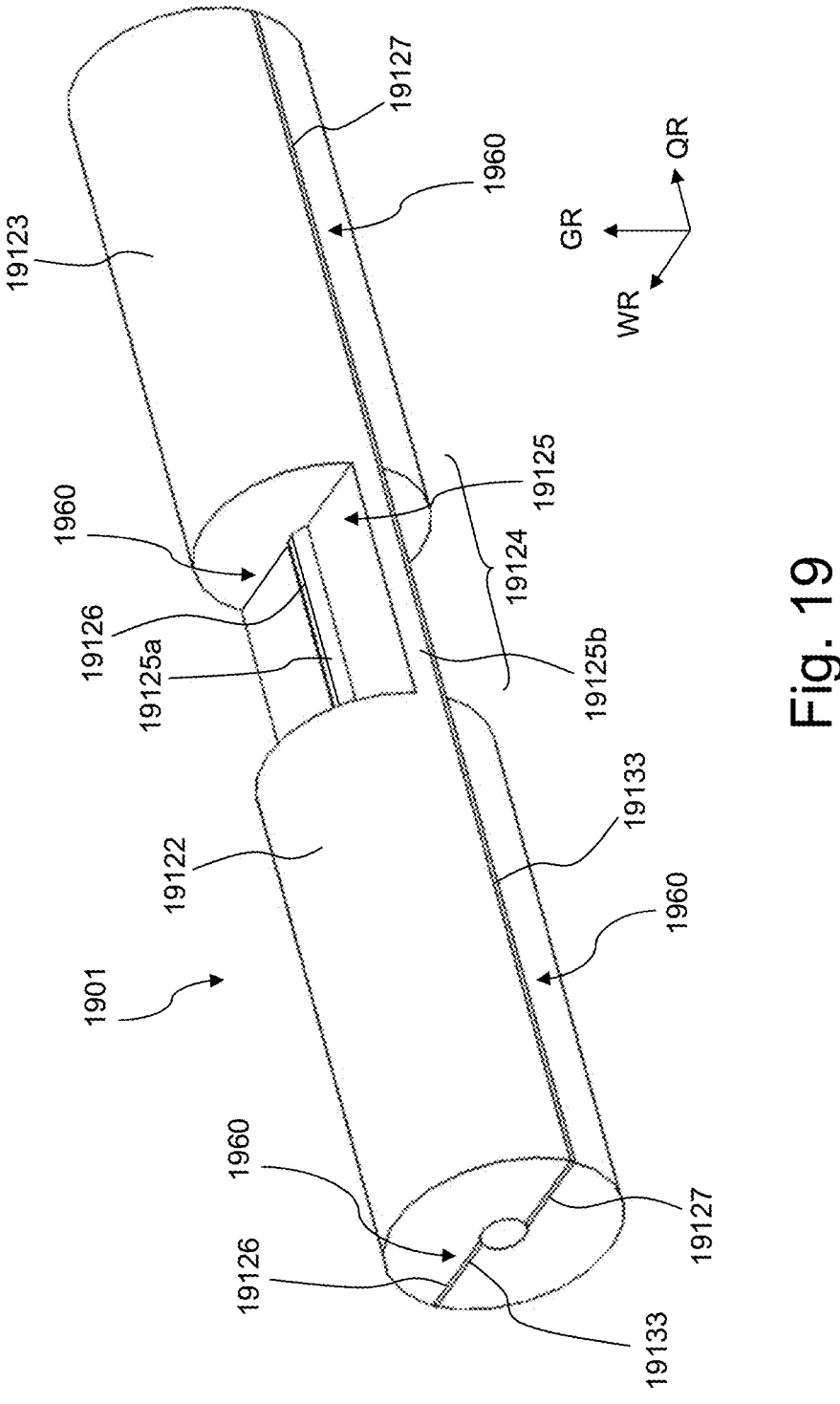
FIG. 19 schematically shows a thirteenth embodiment of an additional element according to the invention, with metal cylinders at end portions and a metal plate as connecting portion, wherein a lower slot is provided on the right side in both metal cylinders, which extends from a lower edge of the sample channel to the metal body outer side and extends perpendicular to the base direction, and wherein an upper slot is provided on the left side of both metal cylinders, which extends from an upper edge of the sample channel to the metal body outer side and runs perpendicular to the base direction.

FIG. 19 shows a thirteenth embodiment of an additional element 1901 for the invention, wherein both metal cylinders 19122, 19123 each have an upper slot 19126 and a lower slot 19127, which are however each arranged in a separate plane spanned by the transverse direction QR and the further direction WR. The upper slot starts from the upper edge of sample space 1904, and the lower slot 19127 starts from the lower edge of sample space 1904 (top and bottom are determined based on the base direction). The slots 19126, 19127 are each filled with a layer 19133 of a dielectric, and the layer 19133 is also continued here in the connecting area 19124 in each case, with a layer portion at the lower side of the plate part 19125b and a layer portion at the upper side of the plate part 19125a. Capacitively acting structures 1960 are formed here by the slots 19126, 19127.

A "lower" alternating circulating current can flow here, for example, as an ohmic current from the lower part of the metal cylinder 19122 via the left plate part 19125a to the lower part of the metal cylinder 19123. However, in order to flow past the passage window 1902 on the right, the current must be capacitively transferred upwards, for example in the rear metal cylinder 19123 through the lower slot 19127. It can then flow ohmically through the right plate part 19125b. To close the circuit, the current must then be capacitively transferred downwards again, for example into the front metal cylinder 19122 through the lower slot 19127. The same applies to an "upper" alternating current circuit.

Figures 20A, 20B:
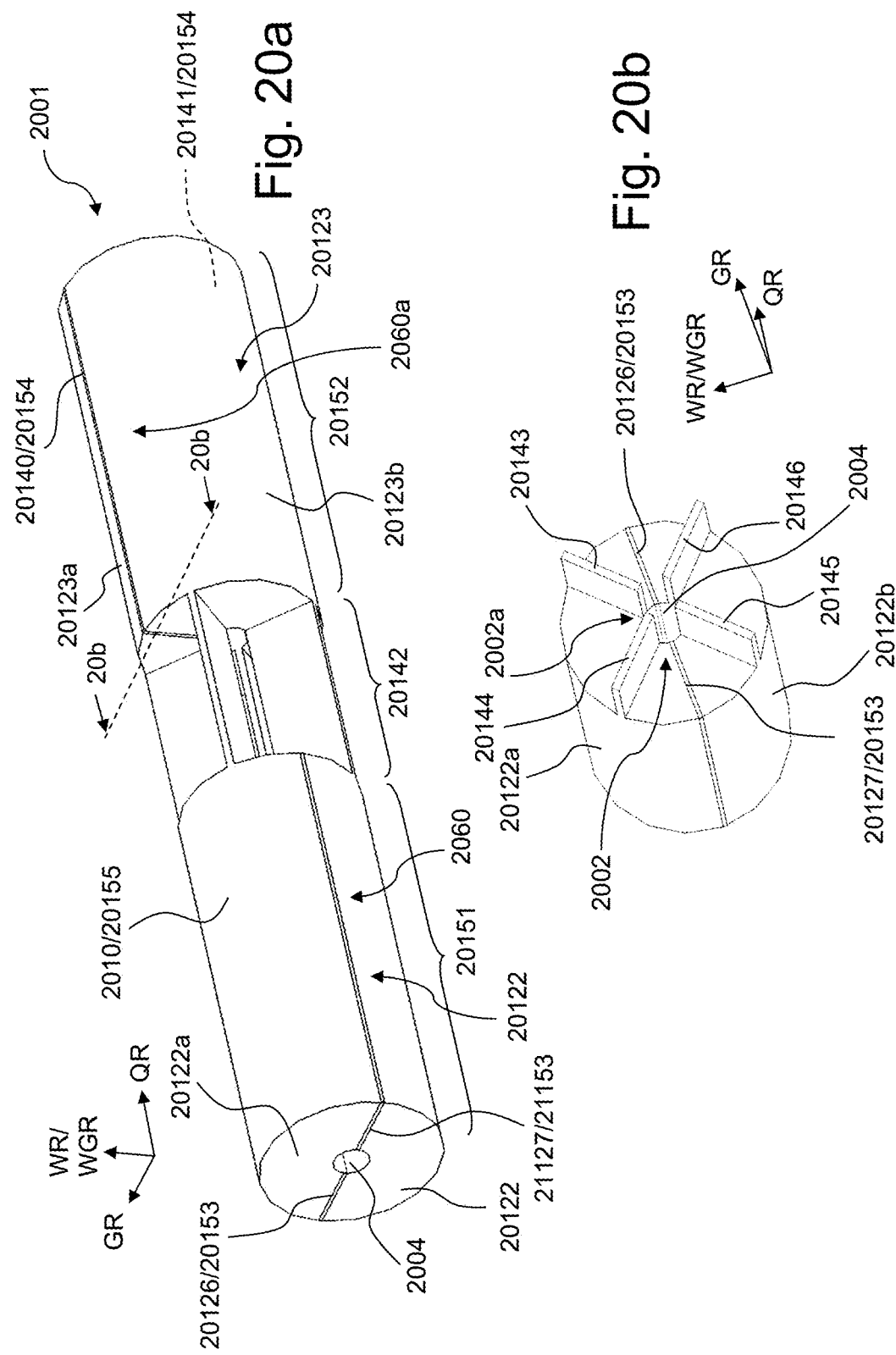
FIGS. 20a-20b schematically show a fourteenth embodiment of an additional element according to the invention, with metal cylinders at end portions and four metal plate parts arranged in a cross shape in the connecting portion.

FIGS. 20a and 20b illustrate a fourteenth embodiment of an additional element 2001. FIG. 20a shows a general view, and FIG. 20b shows the front half of the additional element 2001 with a cross section corresponding to the plane 20b in FIG. 20a.

A first end portion 20151 of the additional element 2001 is formed by a front metal cylinder 20122, and a second end portion 20152 is formed by a rear metal cylinder 20123.

The front metal cylinder 20122 has (similar to what is known from FIG. 14) an upper slot 20126 and a lower slot 20127, which run parallel to the base direction GR (and along the transverse direction QR). The upper slot 20126 and the lower slot 20127 are also collectively referred to herein as the first slot 20153, which divides the metal cylinder 20122 into a right half 20122a and a left half 20122b.

The rear metal cylinder 20123 has a right-sided slot 20140 and a left-sided slot 20141 (not visible in FIG. 20a), each of which is perpendicular to the base direction GR. The right-sided slot 20140 and the left-sided slot 20141 together are also referred to as the second slot 20154, which divides the rear metal cylinder 20123 into an upper half 20123a and a lower half 20123b. The slots 20126, 20127, 20140, 20141 each extend radially outwards from the sample space 2004 to the respective cylinder outer surfaces of the metal cylinders 20122, 20123, and each extend centrally from the sample space 2004.

A connecting portion 20142 connects the metal cylinders 20122, 20123 and is formed with four metal plate parts 20143, 20144, 20145, 20146 which are arranged in a cross shape around the sample channel 2004 (or its projection in the area of the connecting portion 20142). The metal plates 20143, 20144, 20145, 20146 each form an angle of 45° to the base direction BD, and also each form an angle of 45° to the further direction FWD. When projected along the base direction, there is a gap between the radially inner ends of the metal plate parts 20143, 20144, 20145, 20146, which corresponds to a passage window 2002.

In this embodiment, (in the normal orientation presented so far) with respect to a first B1 field parallel to the base direction BD, an alternating circulating current can flow around the passage window 2002, similar to the embodiment of FIG. 14.

An ohmic current can flow from the right half 20122a of the metal cylinder 20122 through the metal plate parts 20143, 20144 into the upper and lower half 20123a, 20123b of the metal cylinder 20123 and further through the metal plate parts 20145, 20146 into the left half 20122b of the metal cylinder 20122. However, a capacitive current transfer is required between the halves 20122a, 20122b of the metal cylinder 20122 via the first slot 20153 as a capacitively acting structure 2060. The subdivision of the rear metal cylinder 20123 into an upper half 20123a and a lower half 20123b by the slots 20140, 20141 is irrelevant. A resonant circuit is set up accordingly.

However, the additional element 2001 can also be operated in a further orientation, namely with a second B1 field parallel to the further direction WR; the previous further direction WR is also referred to in this case as the further base direction WGR. In the projection along the further base direction WGR, a gap also remains between the radially inner ends of the metal plate parts 20143, 20144, 20145, 20146, which corresponds to a further passage window 2002a. A further alternating circuit current is established around the further passage window 2002a.

An ohmic current can flow from the upper half 20123a of the metal cylinder 20123 through the metal plate parts 20146, 20143 into the right and left halves 20122a, 20122b of the metal cylinder 20122 and further through the metal plate parts 20144, 20145 into the lower half 20123b of the metal cylinder 20123. However, a capacitive current transfer is required between the halves 20123a, 20123b of the metal cylinder 20123 via the second slot 20154 as a further capacitively acting structure 2060a. The subdivision of the front metal cylinder 20122 into a right half 20122a and a left half 20122b by the slots 20126, 20127 is irrelevant. A further resonant circuit is set up accordingly.

If the first slot 20153 and the second slot 20154 have a different gap width and/or a different dielectric, an additional element 2001 can thus be provided in a simple manner which, depending on its orientation, has a different resonance frequency of the resonant circuit used in each case.

It should be noted that in the embodiment of FIGS. 20a, 20b, the additional element 2001 is formed with a single, complex metal component, which in the orientation presented so far (B1 parallel GR) functions as a cover element 2010, and in the further orientation (B1 parallel WGR) functions as a further cover element 20155. The cover element 2010 covers a cover zone that corresponds to the projection of the additional element 2001 into the plane perpendicular to the base direction GR (excluding the area of passage window 2002 and the first slot 20153). A further cover element 20155 covers a further cover zone, which corresponds to the projection of the additional element 2001 into the plane perpendicular to the further base direction WGR (excluding the area of the further passage window 2002a and the second slot 20154) (cover zone and further cover zone not marked separately).

FIGS. 21a-21d show a fifteenth embodiment of an additional element 2101 for the invention.

Figures 21A, 21B, 21C, 21D:
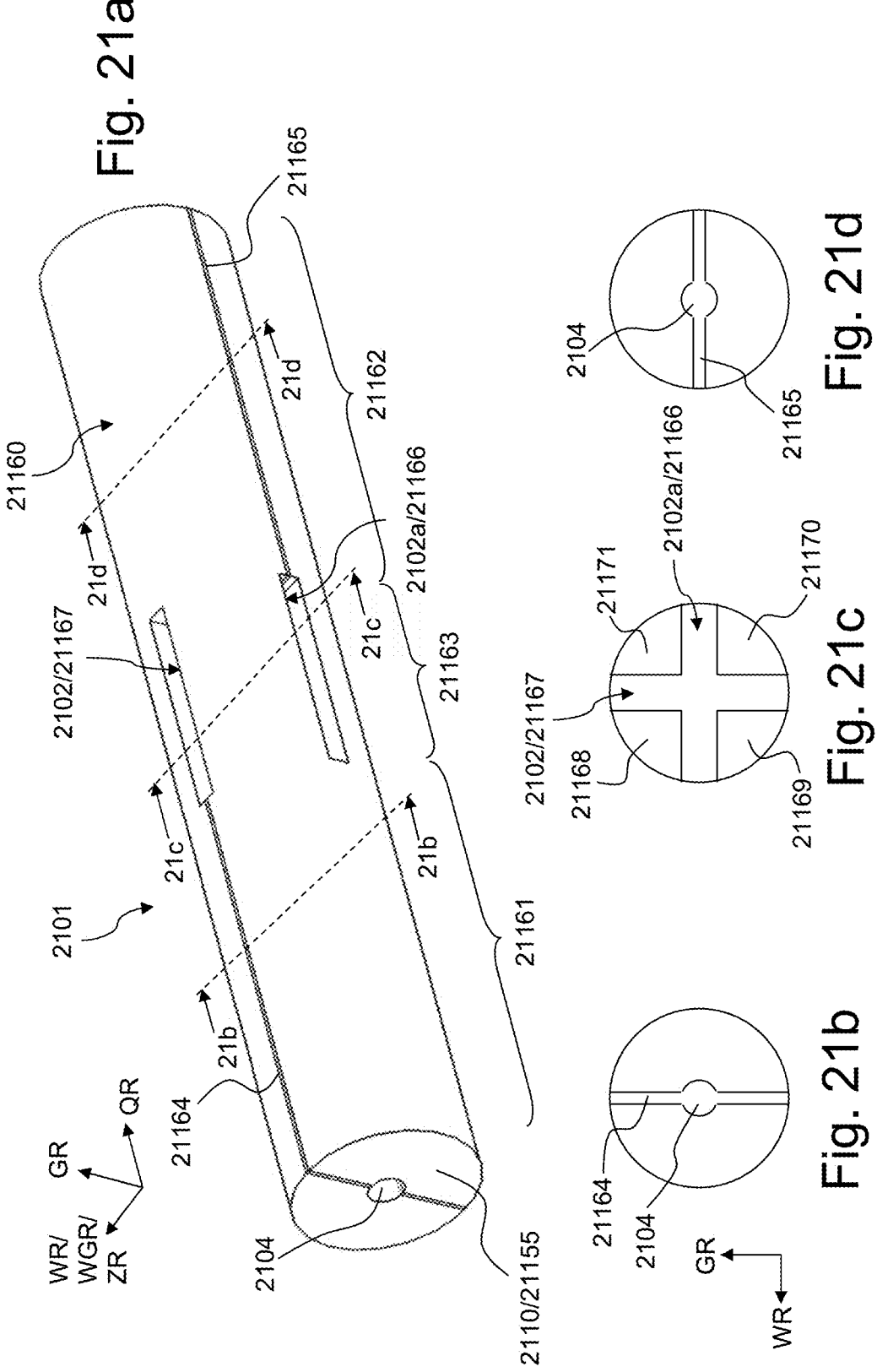
FIGS. 21a-21d schematically show a fifteenth embodiment of an additional element according to the invention, based on a cylindrical metal body.

The additional element 2101 is here substantially formed by a cylindrical metal body 21160 which has a first, front side portion 21161, a second, rear side portion 21162 and a central portion 21163 located therebetween. FIG. 21a shows a general view, FIG. 21b shows a cross section (perpendicular to the transverse direction QR) in the front side portion 21161, FIG. 21c shows a cross section in the central portion 21163, and FIG. 21d shows a cross section in the rear side portion 21162.

The additional element 2101 has a first slotted area 21164 in the first side portion 21161, which extends parallel to the base direction GR (and along the transverse direction QR) in the center of the metal cylinder 21160. Furthermore, the additional element 2101 has a second slotted area 21165 in the second side portion 21162, which extends perpendicular to the base direction GR (and along the transverse direction QR) in the center of the metal cylinder 21160. In addition, the central portion 21163 has a recess 21167 that extends along the base direction GR and intersects the sample space 2104, thereby forming the passage window 2102. The central portion 21163 further has a third slotted area 21166 extending along the further direction WR and intersecting the sample channel 2104. A dielectric can be arranged in each of the slotted areas 21164, 21165.

The embodiment of the additional element 2101 of FIG. 21a corresponds functionally to the embodiment of FIG. 20a. In particular, the additional element 2101 can be operated in the normal orientation with a B1 field along the base direction GR, using the passage window 2102. Likewise, the additional element 2101 can be operated in a further orientation rotated by 90° with a B1 field along the further direction WR (=further base direction WGR). The formation of alternating circulating currents in both orientations corresponds to the information shown in FIGS. 20a, 20b, wherein the sectors 21168, 21169, 21170, 21171 in the central portion 21163 take the place of the metal plate parts (reference signs 20143, 20144, 20145, 20146 in FIGS. 20a, 20b).

In the embodiment of FIG. 21a, the additional element 2101 is also formed with a single, complex metal component, which in the normal orientation (B1 parallel GR) functions as a cover element 2110, and in the further orientation (B1 parallel WGR) functions as a further cover element 21155.

Figure 22:
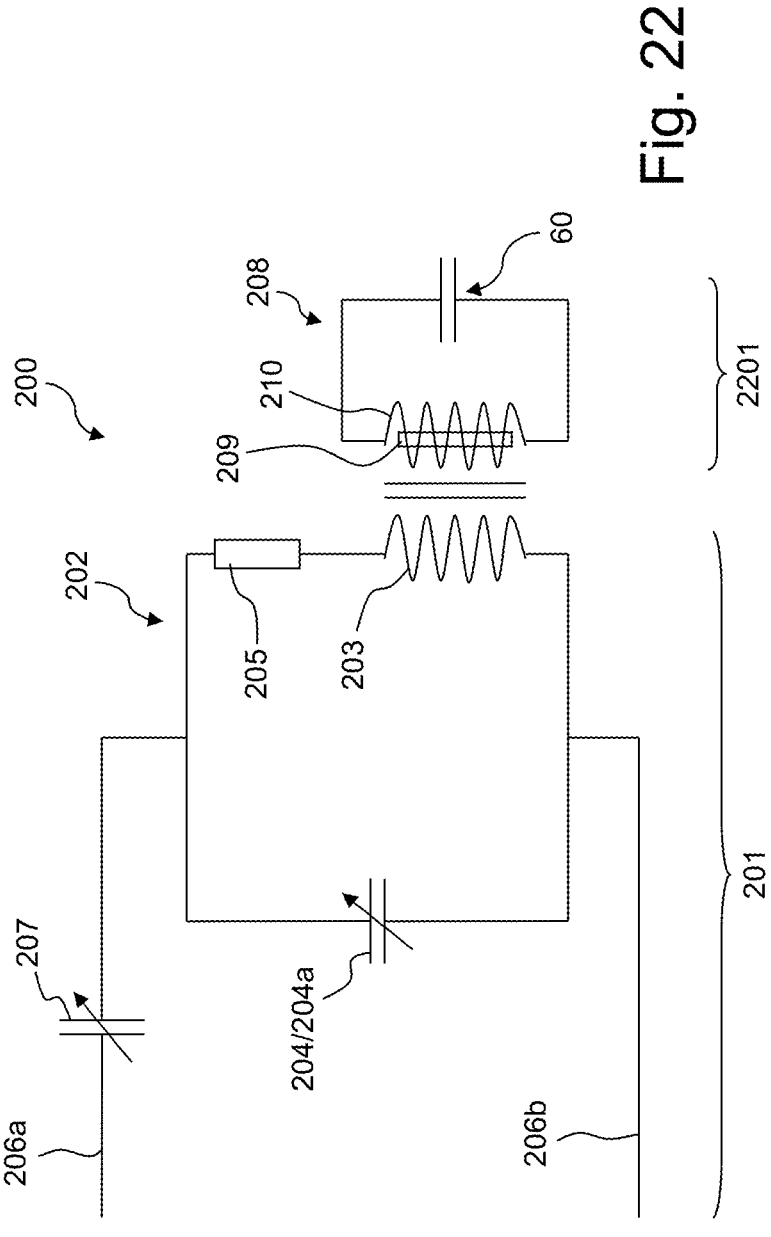
FIG. 22 shows a schematic diagram of an exemplary embodiment of a measurement arrangement according to the invention, with a tuning device for adjusting the resonance frequency of the measuring resonant circuit.

FIG. 22 schematically illustrates part of the electrical circuitry of an exemplary embodiment of a measurement arrangement 200 according to the invention.

The measurement arrangement 200 comprises, on the side of a probe head 201, a measurement resonant circuit 202 comprising an RF coil 203, an adjustable capacitor 204 and an ohmic resistor 205 in a series connection. The adjustable capacitor 204 can be used to tune the frequency of the measuring resonant circuit 202; the adjustable capacitor 204 therefore represents a tuning device 204a. The tuning device 204a can be used to tune a resonance frequency of the measuring resonant circuit 202 between a lowest tunable frequency UF and a highest tunable frequency OF (in each case without an additional element).

The measuring resonant circuit 202 here has connections 206a, 206b for feeding in and reading out RF pulses, wherein the connection 206a leads to the measuring resonant circuit 202 via a further adjustable capacitor 207. The further adjustable capacitor 207 can be used to adjust the impedance ("matching"). The connection 206b can be connected to ground.

According to the invention, the measuring resonant circuit 202 is coupled to the resonant circuit 208 of the additional element 2201 (e.g., additional element 1 of FIG. 1a); for this purpose, the additional element is inserted into a sample receptacle of the NMR probe head 201 (regarding the effect of the coupling, see also FIGS. 5a-5d above). The resonant circuit 208 of the additional element can be assigned a capacitance, which is substantially determined by the at least one capacitively acting structure 60 of the additional element. The sample 209 to be measured is arranged in the additional element and is exposed to the time-varying B1 field of the RF coil 203 through the passage window, wherein a focusing of the magnetic flux is accomplished. The structures of additional element, which set up an alternating current flowing around the passage window, can be assigned an inductance, corresponding to an additional element coil 210 in the illustrated circuit diagram. The coupling of the resonant circuits 202, 208 can be assigned to the coupling of the RF coil 203 and the additional element coil 210 in the circuit diagram. According to the invention, the resonant circuit 208 has a natural resonance with a resonance frequency RF between 5 MHz and 3000 MHz.

Figure 23:
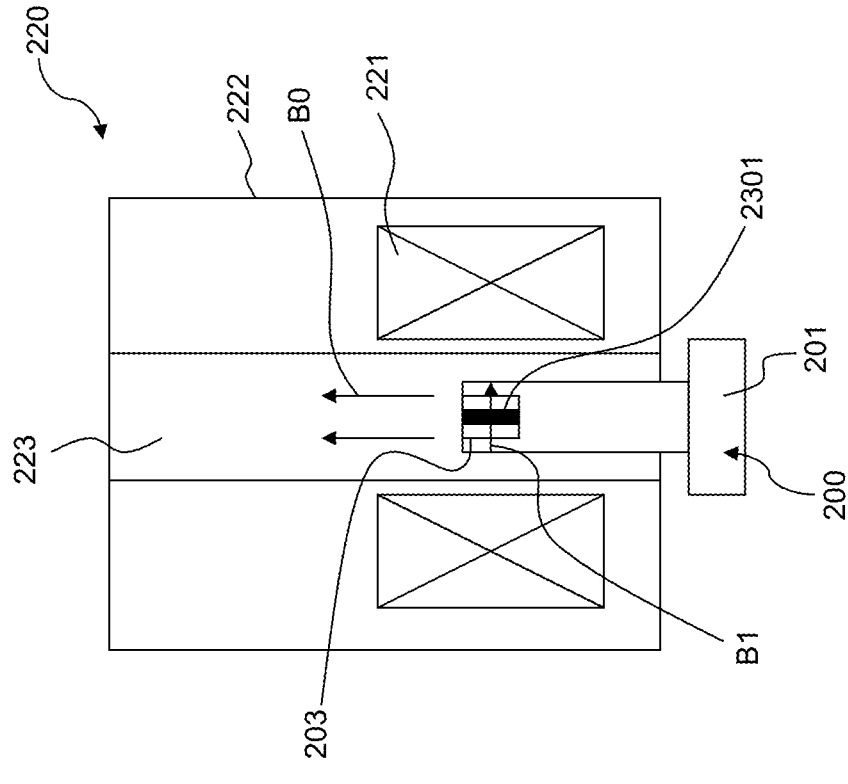
FIG. 23 schematically shows an NMR spectrometer for use with the invention, wherein a measurement arrangement according to the invention is installed in the NMR spectrometer.

FIG. 23 schematically shows an NMR spectrometer 220 in which a measurement arrangement 200 according to the invention is used. The measurement arrangement 200 is formed by an NMR probe head 201 and an additional element 2301 (e.g., additional element 1 of FIG. 1a) arranged in its sample receptacle.

The NMR spectrometer 220 has a background magnet 221 which generates a static magnetic field B0 that is homogeneous at the location of the test sample. The background magnet 221 here is a superconducting coil in a cryostat 222, which has a room temperature bore 223. The NMR probe head 201 protrudes into said bore. The RF coil 203 is located at the front end of the NMR probe head. The additional element, including the test sample to be measured, is in turn arranged in the RF coil 203. The RF coil 203 generates a time-varying magnetic field B1, which is aligned perpendicular to the background field B0.

Figure 24:
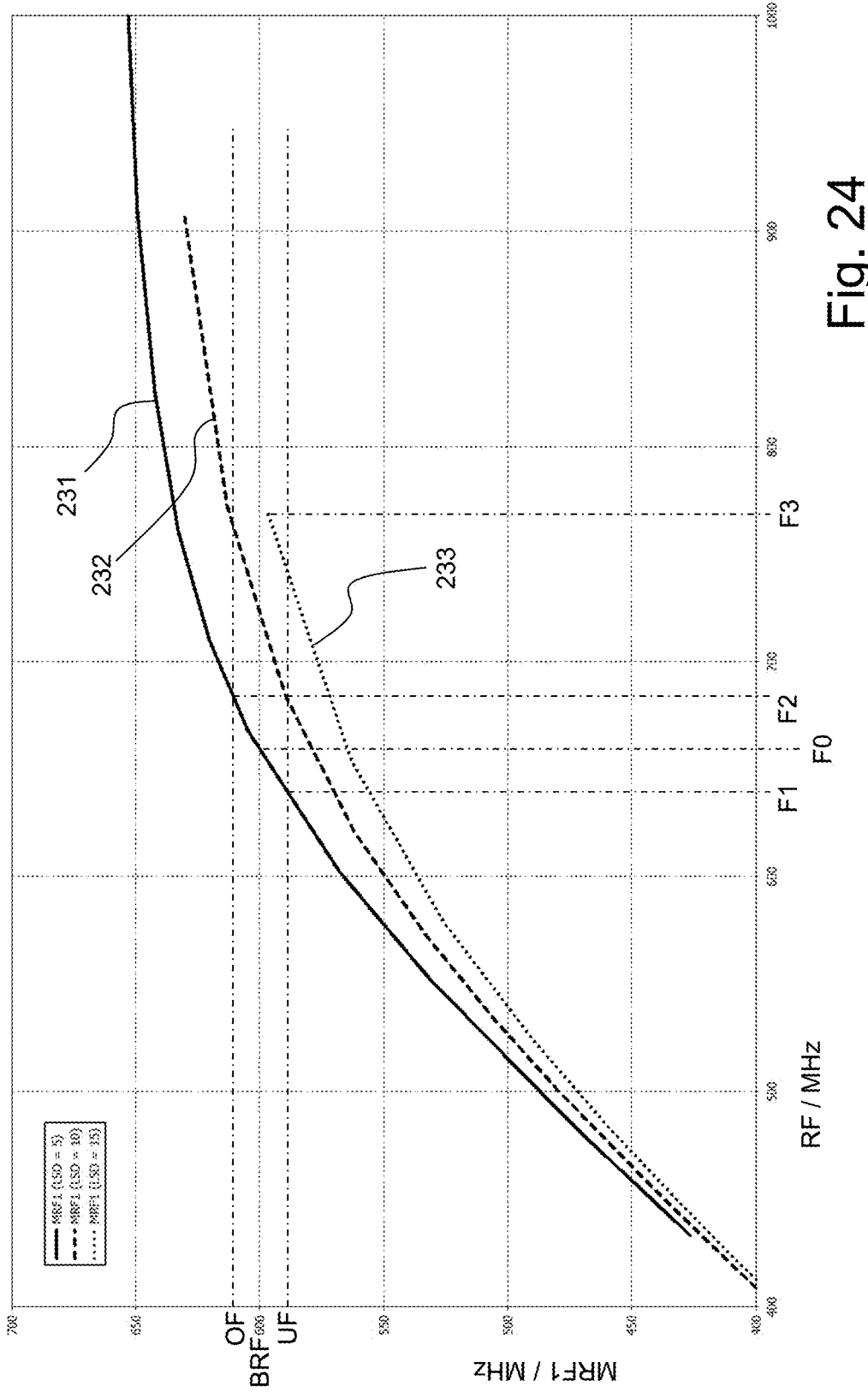
FIG. 24 schematically shows in a diagram mode resonance frequencies MRF1 obtained by simulation for an RF resonator with BRF=600 MHz with inserted additional elements with three different lengths of the passage window, with differently adapted natural resonance.
Figure 25:
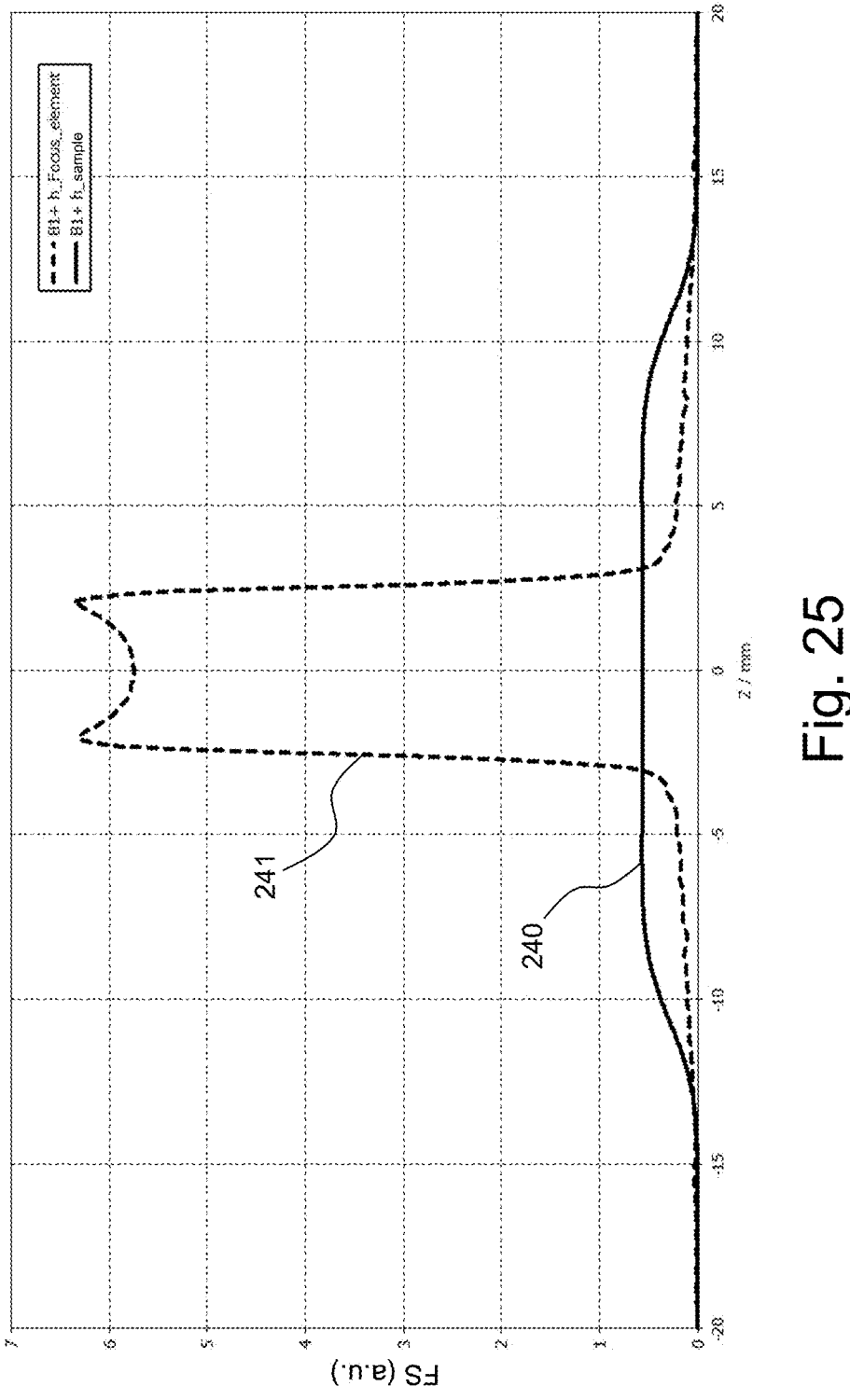
FIG. 25 schematically shows in a diagram the B1 field strengths obtained by simulation as a function of the z-position (along the transverse direction QR) for the RF resonator of FIG. 24 without additional element and with inserted additional element with LSD=5 mm.

FIG. 24 and FIG. 25 illustrate the effect of the invention using an additional element design which is structured substantially as shown in FIG. 17 (eleventh embodiment) based on simulation calculations. Additional elements with different lengths of the long side of the passage window (LSD) were used, with LSD=5 mm, LSD=10 mm and LSD=15 mm. In addition, the resonance frequency RF of the respective additional elements was varied by assuming dielectrics with different relative permittivity $\varepsilon_r$ in the slots and the radial gap. It should be noted that the smallest relative permittivity to be assumed as a limiting case is Er=1, whereby the achievable resonance frequency RF of the additional elements is limited upwards in the respective design; a higher permittivity would then only be possible by changing the design, e.g. by increasing the gap widths or shortening the length of the additional elements. A lower limit of the achievable resonance frequencies RF results from the available dielectric with the highest relative permittivity.

FIG. 24 shows the resonance frequency RF in MHz along the horizontal axis, while the vertical axis represents the frequency for the resulting lower maximum in the resonance curve of the measuring resonant circuit in a conventional NMR probe head, i.e. the mode resonance frequency MRF1 of the lower mode, while also taking into account the frequency shift due to field displacement, in MHz. The resulting mode resonance frequency MRF1 depends on the coupling of the RF resonator or RF coil in the NMR probe head on the one hand and the additional element on the other, and above all on the resonance frequency RF of the additional element. The measuring points for a respective size of the additional element are connected to form curves 231 (for LSD=5 mm), 232 (for LSD=10 mm), 233 (for LSD=15 mm). The base resonance frequency BRF of the measuring resonant circuit of the NMR probe head without additional element is 600 MHz here, and the NMR probe head allows tuning between the frequencies UF=590 MHz and OF=610 MHz.

For the additional element with LSD=5 mm, cf. curve 231, resonance frequencies RF up to over 1000 MHz are accessible. With a resonance frequency RF of F0 of approx. 660 MHz, a mode resonance frequency MRF1 of 600 MHz can be achieved, which corresponds to the base resonance frequency BRF. Resonance frequencies RF between a first cutoff frequency F1 at approx. 630 MHz and a second cutoff frequency F2 at approx. 685 MHz lead to values of MRF1 that are in the range between UF and OF and would therefore still be tunable with the existing NMR probe head.

For the additional element with LSD=10 mm, cf. curve 232, resonance frequencies RF up to approx. 910 MHz are accessible. A resonance frequency RF of approx. 720 MHz leads to a mode resonance frequency MRF1 of 600 MHz, corresponding to BRF. The tunable range for MRF1 between UF and OF is completely accessible for this design (each not shown in detail in FIG. 24).

For the additional element with LSD=15 mm, cf. curve 233, resonance frequencies RF up to approx. 770 MHz are accessible. At this highest accessible resonance frequency F3=770 MHz, a mode resonance frequency MRF1 of only approx. 596 MHz is achieved; the mode resonance frequency MRF1 can therefore not be completely shifted back to the base resonance frequency BRF with the associated additional element. However, since the achievable mode resonance frequency MRF1 is still between UF and OF, the existing NMR probe head can still be tuned with this additional element and NMR measurements are possible.

If the additional element were designed as a conventional Lenz lens (and would therefore not form a resonant circuit with natural resonance like an additional element according to the invention), this would correspond to a resonance frequency RF of the additional element approaching "infinity" (for the purposes of the simulation). In this case, only the resonance frequency of the measuring resonant circuit with additional element would increase to over 650 MHz due to the frequency shift caused by field displacement. This would be outside the tunable range specified by UF and OV, and the NMR probe head could no longer be used for an NMR measurement.

FIG. 25 also shows a diagram in which the field strength FS of the B1 field (vertical axis, in arbitrary units a.u.) in the sample receptacle of the NMR probe head was determined as a function of the z-position (along the transverse direction, horizontal axis in mm) on the central axis of the sample receptacle (also corresponds to the central axis of the sample space of the additional elements) around the magnetic center.

Curve 240 shows the field strength without additional element; in this case, the B1 field has a uniform, low field strength of approx. 0.6 a.u. between approx. −8 mm and +8 mm.

Curve 241 shows the field strength of the B1 field with additional element, wherein the design of the additional element with LSD=5 mm was selected for FIG. 25. With the additional element, the field strength of the B1 field in the range from −2.5 mm to +2.5 mm is approx. 6 a.u., which is approx. 10 times higher than without the additional element. It should be noted that the B1 field is concentrated both in the transverse direction and in the further direction, so that the field magnification is greater than would correspond to the area reduction in the transverse direction alone.

The example of FIGS. 24 and 25 shows that with an additional element according to the invention with a suitable resonance frequency RF of its natural resonance (and suitable coupling to the NMR probe head), the field strength of the B1 field in the area of the test sample can be significantly increased (see FIG. 25), and at the same time the resonance frequency of the measurement resonant circuit for the NMR measurement can be substantially maintained (FIG. 24).

In summary, the invention relates to an additional element for focusing a time-varying magnetic flux (B1), for installation in a sample receptacle of an NMR probe head, wherein the additional element forms, at least in a plan view along a base direction (GR), a cover zone and a passage window, wherein the cover zone encloses the passage window, wherein the additional element has one or more cover elements that are electrically conductive at least in the area of part of their respective edge curve or outer surface, wherein the entirety of the cover elements forms one or more closed conductor loops, wherein the entire covering of the associated one or more conductor loop areas forms the cover zone, which has an area $A_{cover}$, and wherein the passage window has an area $A_{window}$ with $A_{cover} \geq 2*A_{window}$, and wherein the additional element comprises at least one capacitively acting structure, so that the additional element forms an electrical resonant circuit comprising the one or more cover elements, with a natural resonance of a resonance frequency RF, with 5 MHz$\leq$RF$\leq$3000 MHz. The additional element can be used to improve the signal-to-noise ratio with low-volume test samples when measuring in an existing NMR probe head.

The invention claimed is:

1. An additional element for focusing a time-varying magnetic flux (B1), for installation in a sample receptacle of an NMR probe head having a measuring resonant circuit, comprising:

one or more cover elements each of which is electrically conductive along at least a part of a respective outer surface, the one or more cover elements forming one or more closed conductor loops each enclosing a conductor loop area in plan view along a base direction (GR), wherein the one or more conductor loop areas form a cover zone, which has an area $A_{cover}$ in plan view along the base direction (GR);

a passage window that is at least partially enclosed by the cover zone, the passage window having an area $A_{window}$ with $A_{cover}>2*A_{window}$ in plan view along the base direction (GR), wherein the additional element is electrically non-conductive in the area of the passage window and wherein the one or more closed conductor loops in the one or more cover elements cause B1 to be at least partially focused into the passage window; and at least one capacitively acting structure configured such that the additional element forms an electrical resonant circuit comprising the one or more cover elements, with a natural resonance of a resonance frequency RF, where 5 MHZ≤RF≤3000 MHZ, the electrical resonant circuit formed by the additional element at least partially compensating for a shift in a resonant frequency of the measuring resonant circuit.

2. The additional element according to claim 1, wherein the additional element is configured such that at said natural resonance a current on the additional element has no current nodes.

3. The additional element according to claim 1, wherein the additional element is configured such that at said natural resonance a circulating current flows on the additional element, wherein the circulating current completely encloses the passage window.

4. The additional element according to claim 1, wherein the at least one capacitively acting structure comprises two mutually opposing coupling surfaces which are formed on two cover elements or on two opposing ends of a cover element, and wherein the mutually opposing coupling surfaces at least partially overlap and have an overlap area UEF, wherein UEF≥0.5 mm².

5. The additional element according to claim 1, wherein the additional element comprises at least a first sandwich (SW1) of cover elements that comprises a first sandwich plane and a second sandwich plane, wherein one or more of the cover elements extend flatly in the first sandwich plane, which lies perpendicular to the base direction (GR), and one or more of the cover elements extend flatly in the second sandwich plane, which lies perpendicular to the base direction (GR), and wherein the first sandwich plane and the second sandwich plane lie one above the other with respect to the base direction (GR), and the covering elements of the first sandwich plane and the second sandwich plane at least partially overlap.

6. The additional element according to claim 5, wherein in the first sandwich plane the one or more cover elements are arranged circumferentially around the passage window, and ends of the one or more cover elements opposite one another in the circumferential direction are each separated by a first interruption gap, wherein in the second sandwich plane the one or more cover elements are arranged circumferentially around the passage window, and ends of the one or more cover elements opposite one another in the circumferential direction are each separated by a second interruption gap, and wherein the first and second interruption gaps of the first sandwich plane and the second sandwich plane are offset relative to one another in the circumferential direction.

7. The additional element according to claim 5, further comprising at least a second sandwich (SW2) of cover elements, wherein the second sandwich (SW2) comprises a third sandwich plane and a fourth sandwich plane that each lie perpendicular to the base direction (GR), respective cover elements extending flatly in each of the third and fourth sandwich planes, wherein the third sandwich plane and the fourth sandwich plane lie one above the other with respect to the base direction (GR), and the cover elements of the third sandwich plane and the fourth sandwich plane at least partially overlap, and wherein the first sandwich (SW1) of cover elements and the second sandwich (SW2) of cover elements lie one above the other with respect to the base direction (GR), and the cover elements of the first sandwich (SW1) and of the second sandwich (SW2) at least partially overlap.

8. The additional element according to claim 5, further comprising a cylindrical glass tube into which the cover elements of the sandwich or sandwiches are inserted.

9. The additional element according to claim 1, further comprising:

two opposite end portions each formed with a metal cylinder, and a connecting portion formed with a metal plate that runs perpendicular to the base direction and connects the end portions, wherein the passage window is formed in the connecting portion, and electrically subdivides the metal plate of the connecting portion transversely to the base direction (GR); and a sample channel or a sample space that runs along axes of the metal cylinders through the end portions and through the connecting portion in the area of the passage window;

wherein at least one of the end portions has at least one upper slot that extends from the sample channel or sample space to a cylinder outer side of the metal cylinder associated with that end portion and electrically subdivides it in the circumferential direction, wherein at least one of the end portions has at least one lower slot that extends from the sample channel or sample space to a cylinder outer side of the metal cylinder associated with that end portion and electrically subdivides it in the circumferential direction, and wherein the upper slot runs above and the lower slot runs below the metal plate with respect to the base direction (GR).

10. The additional element according to claim 9, further comprising a metal tube arranged on the metal cylinder of a first one of said end portions, which has an upper slot and/or lower slot, wherein a radial gap between the metal cylinder of the first end portion and the metal tube is filled by a dielectric, and the metal tube overlaps the slot on the outer side of the metal cylinder of the first end portion.

11. The additional element according to claim 9, further comprising a central slot that runs perpendicular to the base direction (GR) in the center of the additional element and electrically subdivides the two metal cylinders and the metal plate into an upper half and a lower half, wherein the central slot intersects the sample space or sample channel, and wherein the central slot is filled with a dielectric.

12. The additional element according to claim 1, further comprising:

two mutually opposing end portions, each formed with a metal cylinder; and a connecting portion formed with four metal plate parts that are arranged in a cross shape around a sample channel or sample space and are oriented at 45° to the base direction (GR), the connecting portion connecting the end portions with the metal plate parts, and the passage window being formed in the connecting portion (124), wherein the sample channel or the sample space runs along axes of the metal cylinders through the end portions and the connecting portion in the area of the passage window, and wherein a first one of the end portions has a first slot which runs parallel to the base direction (GR) and electrically subdivides the metal cylinder of this end portion into a right half and a left half, and a second one of the end portions has a second slot which runs centrally through the additional element perpendicular to the base direction (GR) and electrically subdivides the metal cylinder of the second end portion into an upper half and a lower half.

13. The additional element according to claim 1, wherein the additional element is formed from a cylindrical metal body that has a central portion and two side portions on either side of the central portion, and a recess in the central portion to form the passage window, said recess running through the metal body along the base direction (GR) and electrically subdividing the central portion transversely to the base direction (GR), wherein the additional element has a sample channel or sample space which extends along a cylindrical axis of the metal body, and the sample channel or sample space intersects the passage window, and wherein the metal body has slotted areas which extend from the sample channel or sample space towards a metal body outer side and electrically subdivide the metal body in the central portion and/or in one of the side portions.

14. The additional element according to claim 13, wherein the metal body has slotted areas, including:

a first slotted area in a first side portion of the two side portions that runs parallel to the base direction (GR) centrally through the first side portion;

a second slotted area in a second side portion of the two side portions that runs perpendicular to the base direction (GR) centrally through the second side portion; and a third slotted area in the central portion that runs perpendicular to the base direction (GR) centrally through the central portion.

15. The additional element according to claim 1, wherein the additional element has a substantially cylindrical outer shape.

16. The additional element according to claim 1, further comprising a tuning element with which the resonance frequency RF of the electrical resonant circuit can be varied.

17. The additional element according to claim 1, further comprising at least one shielding element that blocks a penetration of time-varying magnetic flux (B1) in at least a part of a sample channel or sample space of the additional element which adjoins the passage window.

18. The additional element according to claim 1, wherein the additional element is configured to be substantially transparent to a time-varying magnetic flux (B1) along a second direction (ZR), which runs orthogonal to the base direction (GR), so that the time-varying magnetic flux (B1) along the second direction (ZR) in a sample channel or sample space of the additional element in the area of the passage window is reduced relatively by a maximum of 20% by the additional element.

19. The additional element according to claim 1, further comprising:

one or more further cover elements each of which is electrically conductive along at least a part of a respective outer surface, the one or more further cover elements forming one or more further closed conductor loops each enclosing a further conductor loop area in plan view along a further base direction (WGR), wherein the one or more further conductor loop areas form a further cover zone, which has a further area $AW_{cover}$ in plan view along the further base direction (WGR);

a further passage window that is at least partially enclosed by the further cover zone, the further passage window having a further area $AW_{window}$ with $AW_{cover} \geq 2*AW_{window}$ in plan view along the further base direction (WGR), wherein the additional element is electrically non-conductive in the area of the further passage window; and at least one further capacitively acting structure configured such that the additional element forms a further electrical resonant circuit comprising the one or more further cover elements, with a natural resonance of a further resonance frequency RFW, where 5 MHZ$\leq$RFW$\leq$3000 MHz.

20. A measuring arrangement comprising an NMR probe head and an additional element according to claim 1, wherein the additional element is arranged in a sample receptacle of the NMR probe head, wherein the probe head comprises an RF coil with which a B1 field can be generated in the sample receptacle along an irradiation direction, and wherein the additional element in the sample receptacle is oriented relative to the RF coil such that the base direction (GR) of the additional element and the irradiation direction are parallel.

21. The measuring arrangement according to claim 20, wherein the probe head comprises a guide aid with which, when the additional element is inserted into the sample receptacle of the NMR probe head, the additional element is automatically aligned with respect to the NMR probe head such that the base direction (GR) of the additional element and the irradiation direction are aligned in a defined manner with respect to one another.

22. The measuring arrangement according to claim 20, wherein the additional element forms a sample channel or sample space for a test sample, wherein the sample channel or sample space has a diameter $D_s$, and a circular cylindrical body with a maximum diameter $D_{max}$ can be introduced into the sample receptacle of the NMR probe head, wherein $D_s$ and $D_{max}$ are each measured perpendicular to a transverse direction (QR), and wherein the transverse direction (QR) runs perpendicular to the base direction (GR), where $D_s \leq 0.6*D_{max}$.

23. The measuring arrangement according to claim 20, wherein the NMR probe head forms an active volume in the sample receptacle, which has a cross-sectional area $A_{active}$ measured in a plane perpendicular to the base direction (GR), where $A_{cover} \geq 0.2*A_{active}$.

24. The measuring arrangement according to claim 20, wherein the NMR probe head has a tuning device with which a base resonance frequency BRF of a natural resonance of an electrical measuring resonant circuit of the RF coil can be tuned without the additional element in the sample receptacle in a range from UF to OF, with UF being a lowest tunable frequency and OF being a highest tunable frequency, where UF<BRF<OF, wherein the presence of the cover element or elements of the additional element in the sample receptacle of the NMR probe head increases the resonance frequency of the measuring resonant circuit by a frequency shift FV relative to the base resonance frequency BRF by displacing magnetic flux, wherein, when the additional element is inserted into the sample receptacle, the measuring resonant circuit is coupled to the electrical resonant circuit formed by the additional element, as a result of which the natural resonance of the electrical measuring resonant circuit is split into a lower mode with a mode resonance frequency MRF1 and an upper mode with a mode resonance frequency MRF2, wherein MRF1 is decreased by a frequency shift RF1 with respect to the uncoupled resonance frequency of the electrical measuring resonant circuit and MRF2 is increased by a frequency shift RF2 with respect to the uncoupled resonance frequency, where MRF1=BRF+FV−RF1 and MRF2=BRF+FV+RF2, and wherein the NMR probe head and the additional element are configured such that OF−BRF>RF1−FV and BRF−UF>FV−RF1.

25. A method of measuring a test sample in an NMR measurement, comprising:

providing a measuring arrangement according to claim 20, arranging the NMR probe head in a B0 field of a background magnet, wherein the B0 field runs in the area of the sample receptacle of the NMR probe head along a transverse direction (QR), wherein the transverse direction (QR) runs perpendicular to the base direction (GR), arranging a test sample in a sample channel or a sample space of the additional element at least in the area of the passage window, wherein for a volume VOL of the test sample VOL≤100 μl, and tuning a mode resonance frequency MRF1 of a lower mode of the measurement resonant circuit with the tuning device to a nuclear resonance frequency of a measurement nucleus contained in the test sample.

* * * * *